(12) United States Patent
Hara

(10) Patent No.: US 7,402,503 B2
(45) Date of Patent: Jul. 22, 2008

(54) DICING SHEET, MANUFACTURING METHOD THEREOF, AND MANUFACTURING METHOD OF SEMICONDUCTOR APPARATUS

(75) Inventor: Kazumi Hara, Suwa (JP)

(73) Assignee: Seiko Epson Corporation (JP)

(*) Notice: Subject to any disclaimer, the term of this patent is extended or adjusted under 35 U.S.C. 154(b) by 302 days.

(21) Appl. No.: 11/159,047

(22) Filed: Jun. 22, 2005

(65) Prior Publication Data

US 2006/0009009 A1   Jan. 12, 2006

(30) Foreign Application Priority Data

Jul. 12, 2004  (JP) .............................. 2004-204499

(51) Int. Cl.
*H01L 21/46* (2006.01)
*H01L 23/48* (2006.01)

(52) U.S. Cl. .................. 438/464; 438/460; 257/782; 257/787

(58) Field of Classification Search ............... 438/465, 438/460, 113, 458, 459, 462, 464, 68, 114; 257/782, 783, 787, 788

See application file for complete search history.

(56) References Cited

U.S. PATENT DOCUMENTS

| 5,989,982 | A | * | 11/1999 | Yoshikazu | .............. 438/462 |
| 6,171,163 | B1 | | 1/2001 | Seko et al. | |
| 6,184,064 | B1 | * | 2/2001 | Jiang et al. | .............. 438/113 |
| 6,462,415 | B1 | | 10/2002 | Ishiguri et al. | |
| 6,972,204 | B2 | * | 12/2005 | Oohata et al. | .............. 438/22 |
| 2004/0038498 | A1 | * | 2/2004 | Ozono et al. | .............. 438/464 |

FOREIGN PATENT DOCUMENTS

| JP | 61-180442 | 8/1986 |
| JP | 63-029948 | 2/1988 |
| JP | 08-069983 | 3/1996 |
| JP | 11-111162 | 4/1999 |
| JP | 2001-196404 | 7/2001 |
| JP | 2004-050305 | 2/2004 |

* cited by examiner

*Primary Examiner*—Kevin M Picardat
(74) *Attorney, Agent, or Firm*—Harness, Dickey & Pierce, P.L.C.

(57) ABSTRACT

A dicing sheet which supports electronic-component aggregation with adhesive in the case of separating the electronic-component aggregation in which a plurality of electronic components are integrated, has a substrate and an adhesion layer which is formed at one surface side of the substrate, in which a concave portion is formed on a surface of the adhesion layer, and the concave portion is formed so that a convex shape member projected from an adhesion surface of the electronic-component aggregation which is adhered to the dicing sheet is inserted.

22 Claims, 13 Drawing Sheets

DICING SHEET, MANUFACTURING METHOD THEREOF, AND MANUFACTURING METHOD OF SEMICONDUCTOR APPARATUS

BACKGROUND OF THE INVENTION

1. Field of the Invention

The present invention relates to a dicing sheet, a manufacturing method thereof, and a manufacturing method of a semiconductor apparatus.

Priority is claimed on Japanese Patent Application No. 2004-204499 filed Jul. 12, 2004, the content of which is incorporated herein by reference.

2. Description of Related Art

A manufacturing method of a semiconductor chip is performed by the following method, that is, a predetermined pattern of the integrated circuit is formed on a semiconductor wafer, and the predetermined pattern of the integrated circuit thereof is cut away, and is divided into parts. The cutting of the wafer is called dicing. In the dicing process of the semiconductor wafer, using a holding member in which an adhesive film (dicing sheet) having an adhesive agent at one side thereof is applied at one surface side of a ring shape of frame of which the size is larger than the size of the semiconductor wafer, a rotation blade is penetrated with regard to the semiconductor wafer in the state in which the semiconductor wafer is attached to the dicing sheet, while each semiconductor wafer is moved along the cutting line (dicing line) which distinguishes each semiconductor wafer, and thereby each semiconductor wafer is divided (for example, Patent Document 1: Japanese Unexamined Patent Application, First Publication No. S61-180442, Patent Document 2: Japanese Unexamined Patent Application, First Publication No. S63-29948).

By the way, at present, because it is necessary for the electronic apparatus having portability such as the portable phone, the notebook type of personal computer, PDA (Personal data assistance), or the like, or the apparatus such as the sensor, the microdevice, the head of a printer, or the like to be miniaturized and the weight reduced, miniaturization of various electric parts such as the semiconductor chip, or the like which is provided at the inside of the above apparatus is attempted. Moreover, the mounting space of the electric parts is extremely limited. Thereby, in order to perform the further high integration, both semiconductor chips which have the same function as each other, or both semiconductor chips which have different functions from each other are laminated, the electrical connection between each semiconductor chip is carried out, and thereby three-dimensional mounting technology which plans the high density mounting of the semiconductor chips is also considered. Furthermore, in the semiconductor chip using such three-dimensional mounting technology, electrodes are formed at both the front surface and the back surface thereof, while the through hole which penetrates the semiconductor chip is provided, and the electrode structure is provided in which both electrodes of the front surface and the back surface is electrically connected via the electric member (penetration electrode) which is filled in the through hole.

By laminating the semiconductor chips which are provided with such electrode structure, the wiring connection between the laminated semiconductor chips can be easily performed.

However, when the semiconductor chip which is provided with the above-mentioned electrode structure is made, it becomes clear that the defect in the dicing process easily occurs. That is, when the semiconductor wafer in which the penetration electrode is formed is adhered to the dicing sheet, because the penetration electrode is projected from the adhesion surface of the semiconductor wafer, it turns out that the close adhesion between the dicing sheet and the semiconductor wafer is inhibited, and the chip peeling or the chip floating at the time of cutting occurs. Even if the chip peeling, or the like does not occur, because the close adhesion between the dicing sheet and the semiconductor wafer is weak, the dust (cutting dust) which is generated by the dicing is mixed in the gap between the sheet and the semiconductor wafer, and thereby it is possible for the semiconductor wafer to be contaminated. Furthermore, because the holding of the semiconductor wafer is not sufficient, cracking may arise in the cutting surface of the semiconductor wafer.

SUMMARY OF THE INVENTION

The present invention is made in order to solve the problems of the above-mentioned conventional technology, and objects thereof are to provide a dicing sheet and a manufacturing method thereof in which electronic-component aggregation such as the semiconductor wafer, or the like can be stably supported with adhesive, and the electronic component such as the semiconductor chip, or the like can be easily picked up after dicing.

Moreover, an object of the present invention is to provide the manufacturing method of the semiconductor apparatus in which the semiconductor chip can be manufactured with high precision and high yield.

In order to solve the above mentioned problem, the present invention is a dicing sheet which supports electronic-component aggregation with adhesive in the case of separating the electronic-component aggregation in which a plurality of electronic components are integrated, has a substrate and an adhesion layer which is formed at one surface side of the substrate, in which a concave portion is formed on a surface of the adhesion layer, and the concave portion is formed so that a convex shape member projected from an adhesion surface of the electronic-component aggregation which is adhered to the dicing sheet can be inserted.

According to the present constitution, the dicing sheet is offered in which the convex shape member of the electronic-component aggregation used to the dicing process can be stored in the concave portion of the adhesion layer, by using the dicing sheet thereof, it can be prevented that a gap between the adhesion layer and the adhesion surface of the electronic-component aggregation is arisen in the circumference of the convex shape member, and thereby the decrease of close adhesion quality of the electronic-component aggregation as the result of forming the gap, and the chip floating at the time of dicing can be prevented. Moreover, because the convex shape member is stored in the concave portion of the adhesion layer, in the case of exfoliating the electronic component after dicing, it is prevented that the convex shape member and the adhesion layer is strongly adhered, the electronic component can be easily and exactly separated, and the improvement of yield in the case of manufacturing the electronic component can be attained.

In the dicing sheet according to the present invention, the concave portions may be formed corresponding to the plurality of convex shape members which are provided at the electronic-component aggregation. The dicing sheet according to the present constitution is preferably used for the dicing of the electronic-component aggregation in which the plurality of convex shape members are provided with some extent of gap. That is, because the concave portion is formed corresponding to each convex shape member, the adhesion layer and the electronic-component aggregation can be adhered to each other in an area between the convex shape members, and thereby the electronic-component aggregation can be stably supported.

In the dicing sheet according to the present invention, the concave portion may be formed having a plane surface area which extends over the plurality of convex shape members provided at the electronic-component aggregation. The dicing sheet according to the present constitution is used for the case in which the plurality of convex shape members are arranged at high density, or for the case in which the convex shape member is minute. In these cases, because there is the case in which the forming of the concave portion corresponding to the individual convex shape member is not desirable in view of manufacturing precision or manufacturing cost for the adhesion layer, the concave portion which can store the plurality of convex shape members at one time may be formed. By such a constitution, the complication of the manufacturing process, or the increase of the manufacturing cost does not arise, and the dicing sheet which can solve the above-mentioned problem can be obtained.

In the dicing sheet according to the present invention, the layer thickness of the adhesion layer may be not less than 70% of the projection height of the convex shape member, and the depth of the concave portion may be not less than 50% of the projection height. When the layer thickness of the adhesion layer is less than 70% of the projection height, a front end of the convex portion reaches to the substrate while penetrating the adhesion layer, and presses the substrate, and thereby the tendency in which the close adhesion quality between the adhesion layer and the electronic-component aggregation is decreased becomes outstanding. Moreover, when the depth of the concave portion is less than 50% of the projection height, the front end portion of the convex shape member excessively breaks into the adhesion layer, the separation of electronic component after dicing becomes difficult, and disadvantages occur.

In the dicing sheet according to the present invention, the concave portion may be formed penetrating the adhesion layer. According to the present constitution, because the convex shape member inserted in the concave portion becomes in the state of not contacting with the adhesion layer, the separation after dicing can be performed more easily.

In the dicing sheet according to the present invention, an alignment mark for positioning with the electronic-component aggregation may be provided. According to the present constitution, the convex shape member can be exactly inserted in the concave portion, and thereby the close adhesion between the electronic-component aggregation and the adhesion layer can be suitably performed.

In the dicing sheet according to the present invention, the alignment mark may be formed while making a concave shape on a surface of the adhesion layer. According to the present constitution, the alignment mark can be formed by the same manufacturing process as the manufacturing process of the concave portion, as the case may be, because the alignment mark can be simultaneously formed accompanied with the manufacturing process of the concave portion, the increase of the person-hour can be prevented, and the convenience on the manufacturing is excellent.

In the dicing sheet according to the present invention, a formation area of the concave portion and a cutting line for dividing the electronic component may be arranged while being horizontally apart from each other.

Moreover, the concave portion may be formed in the formation area of the electronic component which is provided with the convex shape member which corresponds to the concave portion thereof.

When the concave portion of the adhesion layer and the cutting line are arranged while being horizontally overlapped, because the dicing blade passes through the upper portion of the concave portion at the time of dicing, the chip floating, or cracking is easy to occur, and the above phenomena are not desirable.

The present invention is a manufacturing method of a dicing sheet which supports electronic-component aggregation with adhesive in the case of separating the electronic-component aggregation in which a plurality of electronic components are integrated, has a process for forming an adhesion layer at one surface side of a substrate, and a process for forming a concave portion in which a convex shape member projected from the electronic-component aggregation can be inserted on a surface of the adhesion layer.

According to the manufacturing method of the present invention, the dicing sheet can be easily manufactured in which the dicing process of the electronic-component aggregation which is provided with the convex shape member on the adhesion surface for the dicing sheet can be exactly performed at high yield.

In the manufacturing method of the dicing sheet according to the present invention, the concave portion can be formed by pressing a metal mold which is provided with a predetermined roughness shape to the adhesion layer. According to the present manufacturing method, the plurality of concave portions can be formed on the adhesion layer at one time, and thereby the dicing sheet can be very efficiently manufactured.

In the manufacturing method of the dicing sheet according to the present invention, when the concave portion is formed to the adhesion layer, the metal mold which is in the state of being heated up at a temperature of less than 100° C. can be pressed to the adhesion layer. By maintaining the metal mold in the heating state, and pressing the metal mold thereof to the adhesion layer, when the concave portion is formed to the adhesion layer, favorable measuring precision and suitable manufacturing efficiency can be obtained. However, on the other hand, because the material which is cured by heating, or the material which is foamed by heating is used as the adhesion layer which constitutes the dicing sheet, in the case of forming the concave portion, it is necessary for the reaction of the adhesion layer not to be advanced. Therefore, the heating temperature of the metal mold may be set at a temperature of less than 100° C. In the manufacturing method of the dicing sheet according to the present invention, when the concave portion is formed to the adhesion layer, the concave portion can be formed by cutting the adhesion layer partially. That is, the concave portion of the adhesion layer can be formed by cutting and manufacturing the adhesion layer mechanically, using the cutter, or the like.

In the manufacturing method of the dicing sheet according to the present invention, when the concave portion is formed to the adhesion layer, the concave portion can be formed by emitting a laser beam on the adhesion layer.

According to the present manufacturing method, the concave portion can be exactly formed.

In the manufacturing method of the dicing sheet according to the present invention, the process for forming the concave portion may include a process for performing pattern formation of mask material on the adhesion layer, and a process for forming the concave portion by partially removing the adhesion layer via the mask material. According to the present manufacturing method, very small concave portion can be efficiently and exactly formed.

The present invention is a manufacturing method of a dicing sheet which supports electronic-component aggregation with adhesive in the case of separating the electronic-component aggregation in which a plurality of electronic components are integrated, includes a process for attaching an adhesion sheet which is provided with a concave portion in which a convex shape member projected from the electronic-component aggregation is inserted to one surface side of a substrate.

According to the present manufacturing method, because the dicing sheet is constituted by attaching the adhesive sheet on which the concave portion is previously formed and the substrate, the manufacturing of the dicing sheet on which a lot of very small concave portions are formed can be efficiently performed.

In the manufacturing method of the dicing sheet according to the present invention, when the concave portion is formed to the adhesive layer or the adhesive sheet, the alignment mark for positioning the convex shape member of the electronic-component aggregation to the concave portion can be formed to the adhesive layer or the adhesive sheet at the same time as the manufacturing of the concave portion.

According to the present manufacturing method, because the concave portion and the alignment mark can be simultaneously formed, the improvement of the efficiency of the manufacturing process can be realized.

The manufacturing method of the dicing sheet according to the present invention has a process for forming an alignment mark on a substrate in advance of the process for forming the adhesive layer on the substrate, and thereby the concave portion can be formed at a predetermined position on the substrate with a standard of the alignment mark on the substrate. The alignment mark may be formed to the substrate, in such a case, the alignment mark which is formed to the substrate can be used as the standard for positioning in both the process for forming the concave portion and the process for attaching the electronic-component aggregation to the dicing sheet.

A dicing method according to the present invention is a method for dividing the electronic-component aggregation in which the convex shape member is formed on at least one surface thereof into individual electronic components, in which, when the electronic-component aggregation is supported to the dicing sheet with adhesive, the above-mentioned dicing sheet according to the present invention is used, the convex shape member of the electronic-component aggregation is inserted into the concave portion which is formed on the adhesive layer of the dicing sheet, and the electronic-component aggregation and the dicing sheet are adhered to each other. According to the dicing method, the electronic-component aggregation on which the convex shape member is formed is stably supported to the dicing sheet with adhesive, while the electronic components after dicing can be easily separated. Therefore, the improve of yield of the electronic component which is used for the dicing process can be attained.

The present invention is a manufacturing method of a semiconductor apparatus including a process for separating a plurality of semiconductor chips which are formed on a semiconductor wafer, includes a process for laying a dicing sheet which is provided with a substrate, and an adhesive layer which is formed at one surface side of the substrate, a process for forming a concave portion in which a convex shape member projected from the semiconductor wafer is inserted on a surface of the adhesive layer of the dicing sheet, and a process for inserting the convex shape member into the concave portion of the adhesive layer, and adhering the semiconductor wafer and the adhesive layer to each other, and a process for cutting the semiconductor wafer.

In the manufacturing method of the semiconductor apparatus, because the process for forming the concave portion to the dicing sheet and the process for inserting the convex shape member of the semiconductor wafer into the above-mentioned concave portion, and adhering the semiconductor wafer and the dicing sheet to each other are performed as the successional processes, the dicing of the semiconductor wafer can be very efficiently carried out.

In the manufacturing method of the semiconductor apparatus according to the present invention, the convex shape member which is projected from the semiconductor wafer may be a connection electrode which is provided penetrating the semiconductor wafer. According to the present manufacturing method, the semiconductor apparatus which can be laminated via the connection electrode can be manufactured, and the semiconductor apparatus can be offered in which the high density mounting can be easily attained.

A circuit substrate according to the present invention is provided with the semiconductor apparatus which is obtained by the manufacturing method of the semiconductor apparatus according to the above-mentioned present invention. According to the present constitution, the circuit substrate is offered in which miniaturization and weight reduction are attained by the semiconductor apparatus which can be manufactured by the above-mentioned manufacturing method, and can realizes the high density mounting.

An electronic apparatus according the present invention is provided with the semiconductor apparatus which is obtained by the manufacturing method of the semiconductor apparatus according to the above-mentioned present invention. Moreover, the electronic apparatus according the present invention is provided with the circuit substrate according to the above-mentioned present invention. According to these constitution, the electronic apparatus which includes the semiconductor apparatus which can be manufactured by the above-mentioned manufacturing method, and can realize the high density mounting, or the circuit substrate having the semiconductor apparatus thereof is provided, and the electronic apparatus in which miniaturization and weight saving are attained can be provided.

DETAILED DESCRIPTION OF THE INVENTION

Hereinafter, the embodiment of the present invention is explained with reference to the figures.

Figure 1:
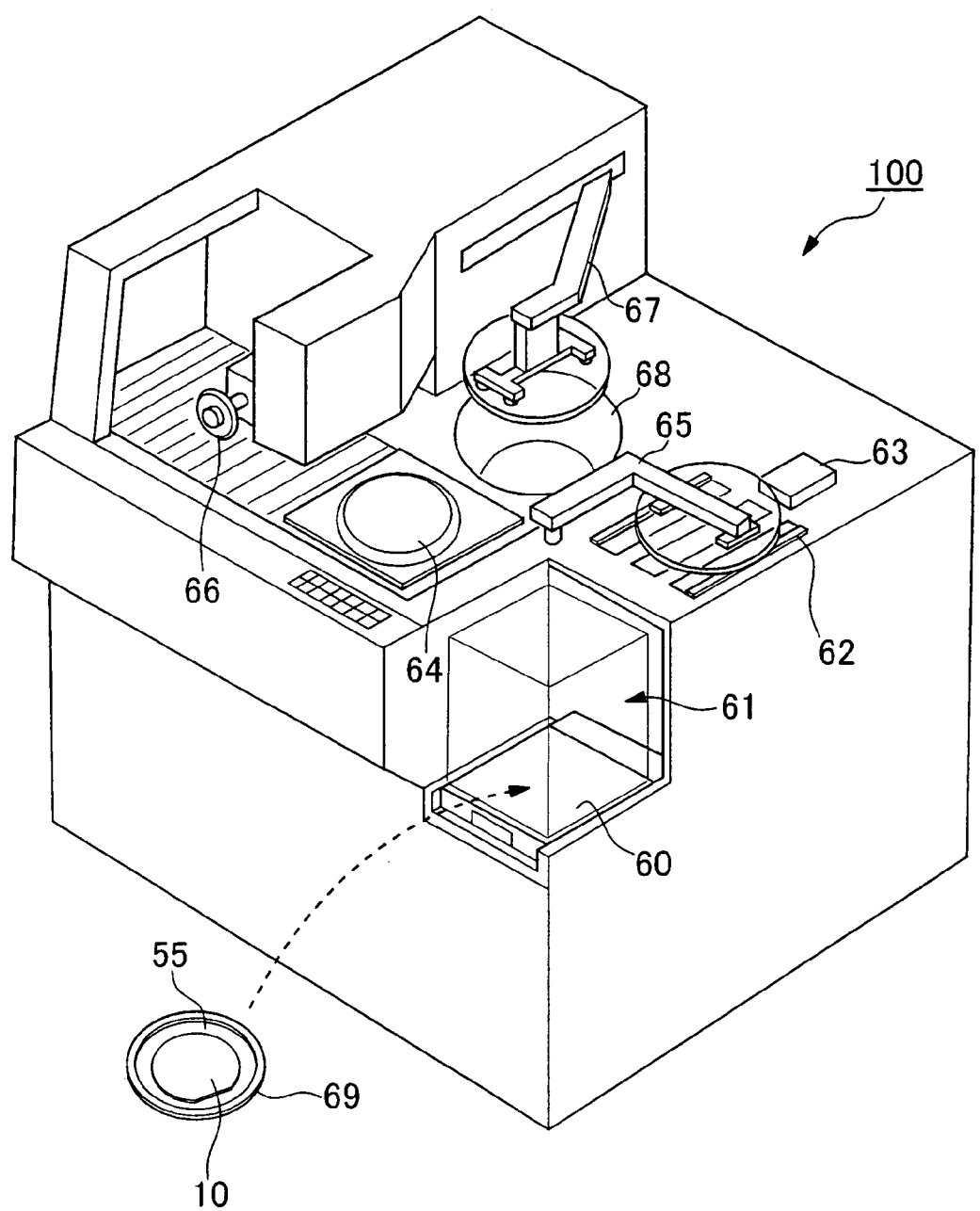
FIG. 1 is a schematic construction view of a dicing apparatus according to the present embodiment.

FIG. 1 is a schematic construction view of a dicing apparatus in which a dicing sheet according to the present embodiment can be applied. In the dicing apparatus 100, a semiconductor wafer (electronic-component aggregation) 10 which is fixed to a ring frame 69 via the dicing sheet 55 is sent within the dicing apparatus 100, and is carried out the dicing, and thereby the semiconductor wafer 10 is divided into the individual semiconductor chips (electronic components) (See FIG. 5).

In addition, although, as mentioned hereinafter, the dicing sheet 55 according to the present invention is suitably used for the dicing process of the semiconductor wafer which is provided with a connection terminal which is projected penetrating the semiconductor wafer, the electronic-component aggregation in which the dicing process can be performed using the dicing sheet 55 is not limited to the above-mentioned semiconductor wafer. That is, the dicing tape according to the present invention can be suitably used for dividing the one in which a plurality of semiconductor chip is provided in succession on a resin substrate such as a TAB tape, a semiconductor package in which the semiconductor elements which is provided on the semiconductor wafer in succession is sealed by the resin layer, or the one in which the electrical element is formed on a ceramic substrate or on a glass substrate into the individual electronic components.

The dicing apparatus 100 is provided with a cassette 61 which stores the semiconductor wafer 10, a cassette putting board 60 in which the cassette 61 is set so that the cassette 61 can be moved up and down, a carrying-out mechanism 63 in which the semiconductor wafer 10 is taken out from the cassette 61, and is carried to a temporary setting portion 62, a first transportation portion 65 in which the semiconductor wafer 10 arranged to the temporary setting portion 62 is transported on a chuck table 64, a dicing mechanism 66 in which the dicing of the semiconductor wafer 10 which is put on the chuck table 64, and is fixed is performed, and a second transportation portion 67 in which the semiconductor wafer 10 which is performed the dicing is transported to a washing portion 68.

In addition, although, in the actual dicing apparatus, the temporary setting portion 62, the dicing mechanism 66, the washing portion 68, and the like are operated in the state of being covered with a dustproof cover, in the present embodiment, the illustration thereof is omitted in order to make the figures easy to see.

The dicing mechanism 66 is provided with a ring shaped dicing blade (see FIG. 8D), and a driving unit which rotates and drives the dicing blade, and has the function of rotating the dicing blade and cutting the semiconductor wafer. The dicing mechanism 66 is provided with a position detecting unit in order to detect the dicing position of the semiconductor wafer 10 which is put on the chuck table 64. For example, the above-mentioned position detecting unit is composed of a light emitting unit which emits the light to the semiconductor wafer 10, and a pickup unit (CCD camera, or the like) which pick up the light emitting area on the semiconductor wafer 10.

Moreover, the dicing mechanism 66 may be provided with two types of dicing blades (for example, the one of which the edge is a tapered edge, and the other of which edge is approximately straight). The dicing is performed until the way of the semiconductor wafer using the dicing blade of which the edge is a tapered edge (approximately V-shaped in cross-sectional view) (intermediate dicing), then, the dicing is performed using the dicing blade of which the edge is a straight (approximately U-shaped in cross-sectional view) along the same dicing line as the dicing line in the intermediate dicing, and thereby the occurrence of cracking or the chipping on the cutting surface of the semiconductor chip can be suppressed.

Figure 2:
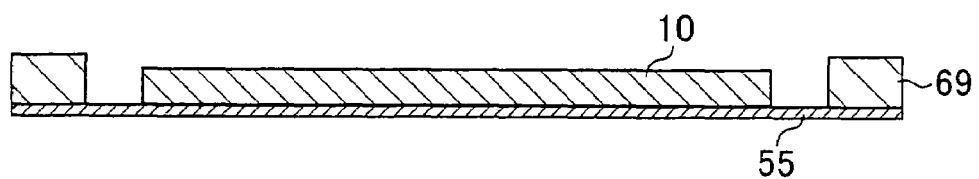
FIG. 2 is a cross-sectional view of the work which is introduced into the dicing apparatus of FIG. 1.

FIG. 2 is a side cross-sectional view of the ring frame 69, and the like shown in FIG. 1, the dicing sheet 55 is attached to the side of under surface in the figure of the ring frame 69, and the semiconductor wafer 10 is adhered on the dicing sheet 55 within the ring frame 69. Furthermore, the work which is constituted as such is introduced into the dicing apparatus 100, is transported, and is fixed to the chuck table 64.

Figure 3:
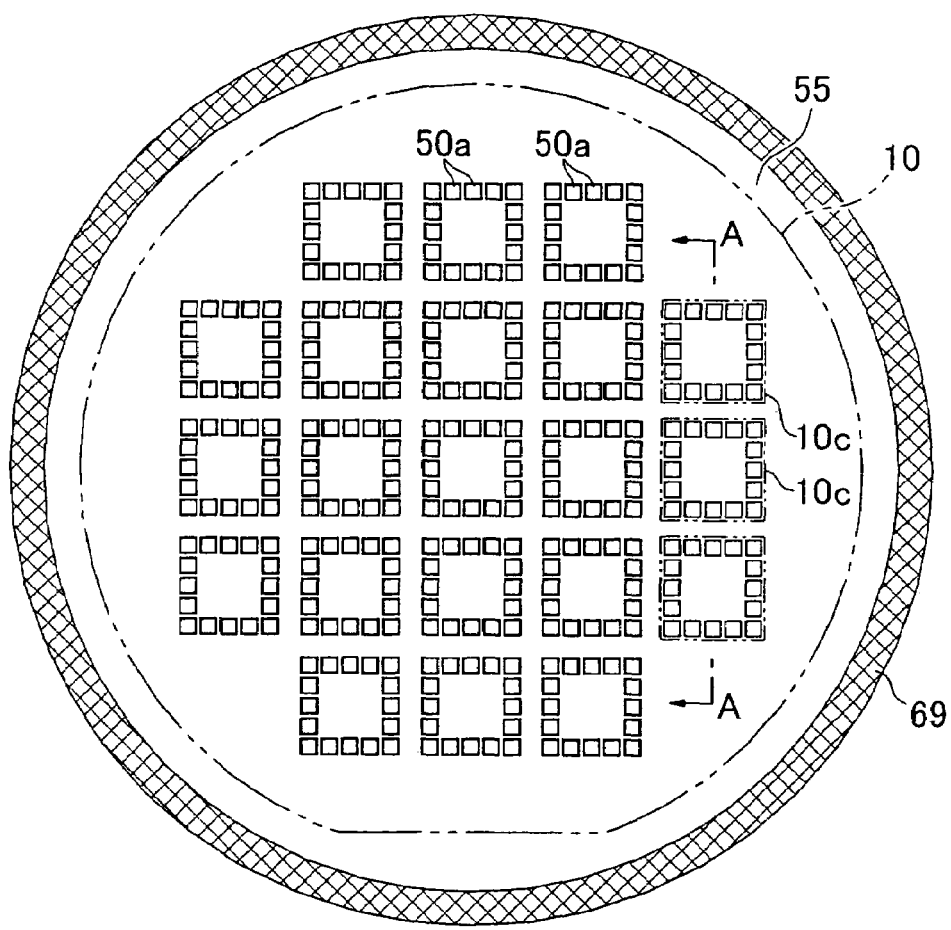
FIG. 3 is a plan construction view of the dicing sheet and a ring frame according to the present embodiment.
Figure 4:
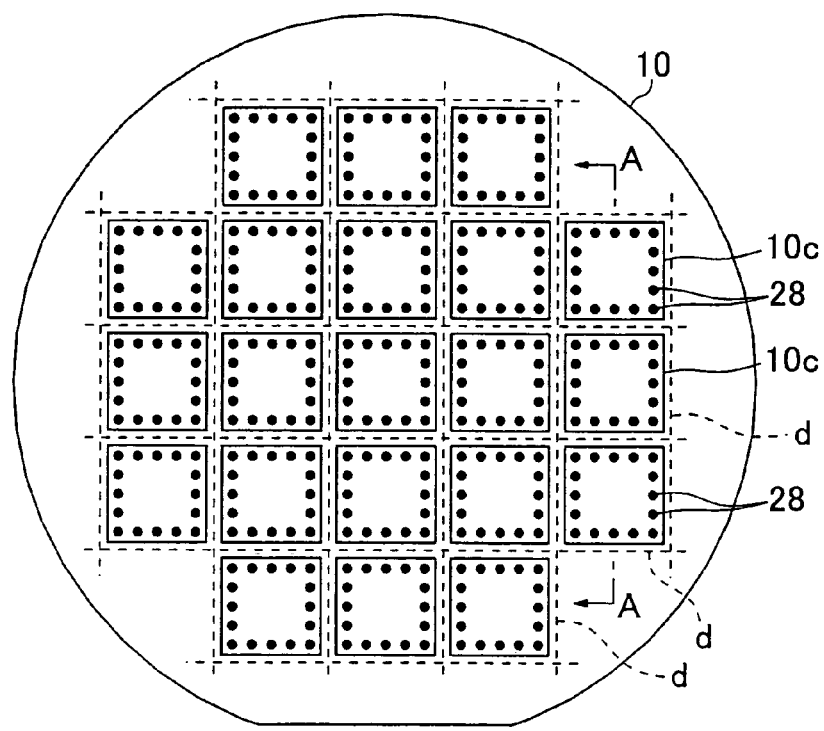
FIG. 4 is a plan construction view of a semiconductor wafer according to the present embodiment.

FIG. 3 is a plan constitution view of the work shown in FIG. 1 and FIG. 2, and FIG. 4 is a plan constitution view of the semiconductor wafer 10. Moreover, FIG. 5 is a cross-sectional construction view along A-A line shown in FIG. 3 and FIG. 4.

Figure 5:
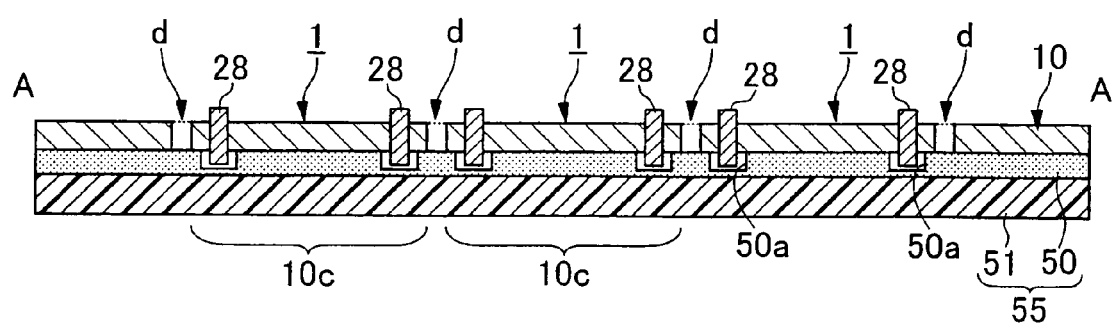
FIG. 5 is a cross-sectional construction view along A-A line of FIG. 4.

As shown in FIG. 3 and FIG. 5, a plurality of concave portions 50a are formed on the upper surface (this side in FIG. 3) of the dicing sheet 55 which is attached to the ring frame 69, the concave portions 50a are arranged at a rectangle frame shape seen from the plane surface, and forms the concave portions group, and the above-mentioned concave portions group is arranged at approximately matrix shape seen from the plane surface.

As shown in FIG. 4, a plurality of division areas (shot areas) 10c are set to the matrix shape seen from the plane surface on the active surface (this side surface in FIG. 4) of the semiconductor wafer 10, the electronic circuit which is composed of the transistor, the memory element, and other electronic element, as well as the electric wiring, the electrode pad, and the like is formed within each division area 10c, while a plurality of connection electrodes 28 which penetrate the semiconductor wafer 10 in the direction of plate thickness are formed within each division area 10c. Connection electrodes 28 are arranged at a rectangle frame shape seen from the plane surface along each side end of each division area 10c. Furthermore, in the dicing apparatus 100, the semiconductor wafer 10 shown in FIG. 4 is cut along the dicing line which is set between the division areas 10c, and, as shown in FIG. 5, is divided into the individual semiconductor chips 1.

(Dicing Sheet)

As shown in FIG. 5, the dicing sheet 55 is provided with a substrate 51, and an adhesive layer 50 which is formed at one surface side (upper surface side in the figure) thereof. A plurality of concave portions 50a are formed on the surface of the adhesive layer 50, and each concave portion 50a stores the projection part of the connection electrode 28 which penetrates the semiconductor wafer 10.

As the substrate 51, the same substrate as in the conventional well-known dicing sheet can be used without any limitation. For example, the resin film can be suitably used, a polyethylene film, a polypropylene film, a cellulose film, a polyester film, a polycarbonate film, and the like are illustrated, or a film in which a fluoride coat, a carbamide coat, or a coating of paintable bridged silicon is performed on a polyester film, or a film in which a polyester film is used as the base, and a polyethylene film or a polymethyl pentene polymer file is laminated, or the like is illustrated.

The conventionally well-known various pressure-sensitive adhesives can be used as the adhesive layer 50. As such adhesives, for example, the adhesives such as a rubber system, an acrylics system, a silicon system, poly vinyl ether, and the like can be used. Moreover, an optical hardening type or a heat foaming type of adhesive can also be used. As an optical hardening type of adhesive, the adhesive in which an acrylic adhesive and a photo polymerizable compound are the principal ingredients is known. As the photo polymerizable compound, for example, the low molecular weight compounds are widely used in which at least two photo polymerizable carbon-carbon double bonds is provided within the molecule which can become a three-dimensional network by the light radiation, concretely, a trimethylol propane triacrylate, tetramethylol methane tetraacrylate, pentaery thritoltriacrylate, a pentaery thritoltetraacrylate, dipentaerythritol monohydroxy pentaacrylate, dipentaerythritol hexaacrylate, or 1,4-butyleneglycol diacrylate, 1,6-hexanediol diacrylate, polyethyleneglycol diacrylate, oligoester acrylate, urethane acrylate, and the like are used.

A photo polymerization initiator can be mixed into the optical hardening type of adhesive. The polymerization hardening time due to the light radiation and the amount of the light radiation can be decreased by adding the initiator. As the initiator, an optical initiator such as a benzoin compound, an acetophenone compound, an acylphosfinoxide compound, a titanocene compound, a thioxanthene compound, a peroxide compound, or the like, or a sensitizer such as an amine, a quinone, or the like can be used.

As the adhesive which constitutes the adhesive layer 50, the gas generating agent which generates the gas by the giving of the light or the heat may be adjoined. In such a case, an adhesive power is decreased by the hardening of the adhesive layer 50 due to the light irradiation or the heating, furthermore, the function is attained in which the gas generated by the light irradiation or the heating is moved to the interface between the adhesive layer 50 and the semiconductor wafer 10, and the adhesive power is decreased, and thereby the pickup of the semiconductor chip after dicing becomes easier.

As such a gas generating agent, for example, an azo compound, or an azide compound is suitably used, and it is more desirable to use the azo compound in view of the ease of handling, or the controlling property of the gas. As the azo compound, for example, 2,2'-azobis-(N-butyl-2-methyl propionic amide), dimethyl 2,2'-azobisisobutylate, 4,4'-azobis (4-cyan carbnic acid), 2,2'-azobis (2,4,4-trimethyl pentane), or the like is used. These azo compounds generate nitrogen gas by giving the light, or the heat, or the like.

In the dicing sheet 55 according to the present embodiment which is provided with the above constitution, the concave portion 50a is formed to the adhesive layer 50, and thereby, when the semiconductor wafer 10 is adhered, the semiconductor wafer 10 can be fixed with sufficient adhesive power, while, after the dicing of the semiconductor wafer 10 is performed, and is divided into the individual semiconductor chips 1, the semiconductor chips 1 can be easily separated from the adhesive layer 50, and thereby the semiconductor chips 1 can be surely picked up.

In addition, although the concave portion 50a which is formed to the surface of the adhesive layer 50 is the rectangle shape seen from the plane surface in the present embodiment, if the connection electrode 28 can be stored, any other shape may be adopted as the concave portion 50a, and various shapes such as the circular shape seen from the plane surface, the polygon shape, or the like can be adopted.

(The Manufacturing Method of the Dicing Sheet and the Dicing Method)

Figure 8:
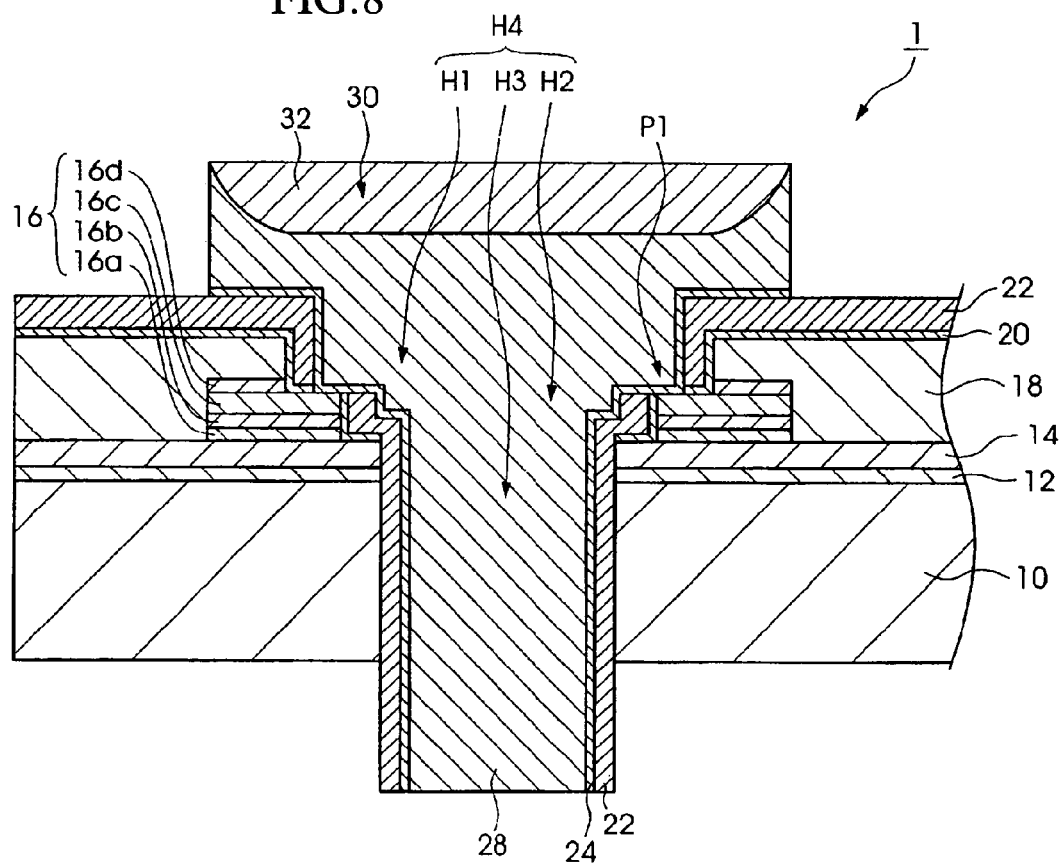
FIG. 8 is a cross-sectional view which shows a principal part of the semiconductor chip according to the present embodiment.

Next, the manufacturing method of the dicing sheet 55, and the dicing process using the dicing sheet 55 thereof are explained. FIG. 8 is a cross-sectional process view which shows the dicing process using the dicing sheet 55 according to the present invention.

First, as shown in FIG. 8A, the substrate 51 which is composed of the resin file, and the like is prepared, then, as shown in FIG. 8B, the adhesive layer 50 is formed on the substrate 51. In order to form the adhesive layer 50, the above-mentioned adhesive is painted at the suitable thickness by the well-known methods such as a roll coater, knife coater, a gravure coater, a die coater, a reverse coater, and the like, and is dried. Or, the adhesion sheet which is composed of the adhesion of which shape is the sheet shape may be adhered to the substrate 51.

Then, a plurality of concave portions 50a are formed on the surface of the adhesive layer 50 which is formed on the substrate 51.

As the formation method of these concave portions 50a, a method in which the metal mold of which shape is convex configuration corresponding to the concave portions 50a is pressed to the adhesive layer 50, and thereby the configuration is transferred, a method in which the adhesive layer 50 is directly manufactured using a cutting unit, a method in which the adhesive layer 50 is partially removed by the laser beam irradiation, a method in which a predetermined pattern of mask material is formed on the adhesive layer 50, and the adhesive layer 50 is partially removed via the mask material, and the like can be used. Alternative, the adhesive sheet which is previously provided with the concave portions 50a is stuck with the substrate 51, and thereby the dicing sheet 55 may be constituted.

When the concave and convex shape is formed to the adhesive layer 50 by pressing the metal mold is used, by heating and pressing the metal mold, the improvement of configuration transferring property for the adhesive layer 50 and the manufacturing efficiency can be attained, however; because, when the adhesive layer 50 is heated, occasionally, the reaction of the adhesive layer 50 is promoted, and is hardened, or the gas is generated, the heating temperature of the metal mold is set at the temperature of the extent that the above-mentioned hardening or the gas generating is not occurred, for example, at the temperature of less than 100° C.

Figure 6A:
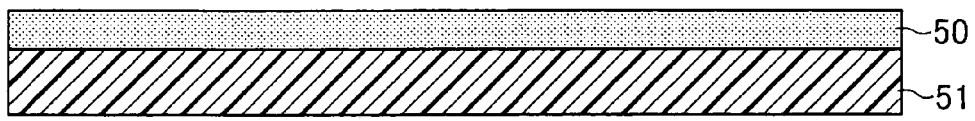
FIG. 6A is a process view which shows a manufacturing method of the dicing sheet and a dicing process.
Figure 6B:
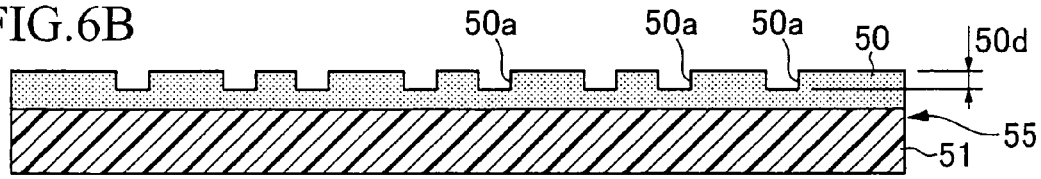
FIG. 6B is a process view which shows a manufacturing method of the dicing sheet and a dicing process.

The depth 50d of the concave portions 50a shown in FIG. 6B is desirably not less than 50% of the projection height (the projection height from the adhesive surface of the semiconductor wafer 10) of the connection electrode 28 which is inserted into the concave portions 50a in the after-mentioned process, more desirably, is not less than 70%. Desirably, the concave portions 50a are formed so that the depth 50d of the concave portions 50a is larger than the projection height of the connection electrode 28. Because, when the connection electrode 28 is inserted into the concave portion 50a of which depth is smaller than the projection height of the connection electrode 28, the front end portion of the connection electrode 28 is pulled into the adhesive layer 50 from the bottom surface of the concave portion 50a, the adhesive layer 50 is suitably formed at the thickness of the extent that the substrate 51 and the penetration electrode 28 are not in contact with each other, that is, at the layer thickness which is larger than the projection height of the connection electrode 28. This is because when the state arises in which the connection electrode 28 which penetrates the adhesive layer 50 is in contact with the substrate 51, or presses the substrate 51, the close adhesion between the adhesive layer 50 and the semiconductor wafer 10 near the penetration electrode 28 becomes insufficient, and thereby the chip floating occurs at the time of dicing.

Moreover, the concave portions 50a may be formed penetrating the adhesive layer 50. When the concave portions 50a which penetrate the adhesive layer 50 are provided, because the connection electrode 28 of the semiconductor wafer 10 and the adhesive layer 50 are not in contact with each other, it becomes easy to separate the semiconductor chip 1 from the adhesive layer 50 after dicing.

Figure 6C:
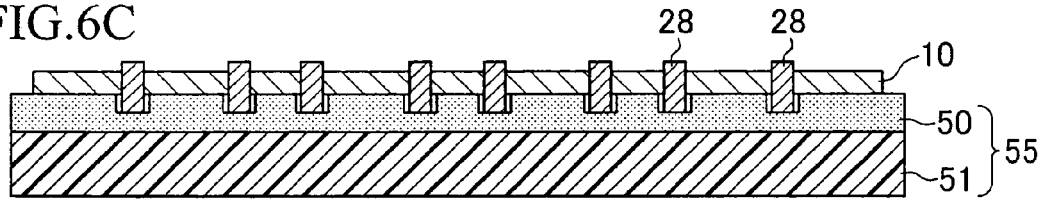
FIG. 6C is a process view which shows a manufacturing method of the dicing sheet and a dicing process.

When the concave portions 50a are formed, after the dicing sheet 55 is attached to the ring frame 69 (not shown in FIG. 6A and FIG. 6B), as shown in FIG. 6C, the semiconductor wafer 10 is adhered to the adhesive layer 50. At this time, the semiconductor wafer 10 and the adhesive layer 50 are positioned at each other, and thereby the connection electrode 28 which is formed so as to be arranged to the semiconductor wafer 10 is inserted into the concave portion 50a of the corresponding adhesive layer 50. At this time, if the alignment mark is formed to the substrate 51 or the adhesive layer 50, the positioning with the semiconductor wafer 10 can be exactly performed.

In the conventional dicing sheet, because the concave portion 50a is not provided on the surface of the adhesive layer 50, when the semiconductor wafer 10 which is provided with the connection electrode (convex shape member) 28 projected from the adhesive surface tries to adhere to the adhesive layer 50, the problem is occurred in which the adhesive layer is pressed by the connection electrode 28, the gap is arisen in the circumference of the connection electrode 28, the adhesion of the semiconductor wafer 10 is not sufficient, and thereby the chip floating or cracking is easy to occur at the time of dicing. Moreover, when the method is adopted in which the layer thickness of the adhesive layer becomes larger, and the projecting part of the connection electrode 28 is filled up to the adhesive layer in order to eliminate the gap, the semiconductor wafer 10 is suitably adhered to the adhesive layer 50; however, when the semiconductor chip is separated after dicing, because the connection electrode 28 is broken into the adhesive layer, the problem arises in which the separation becomes difficult. In contrast, in the case of the present embodiment, when the dicing sheet 55 and the semiconductor wafer 10 are adhered to each other, because the connection electrode 28 which is a convex shape member of the semiconductor wafer 10 is inserted into the concave portions 50a which is formed to the dicing sheet 55, the adhesive surface of the semiconductor wafer 10 and the adhesive layer 50 are suitably adhered to each other without any inhibition due to the connection electrode 28, and the semiconductor wafer 10 is suitably supported.

When the lamination of the semiconductor wafer 10 is performed, the dicing sheet 55 may be tensioned, and in contrast, the dicing sheet 55 may not be tensioned. Furthermore, the lamination of both sides may be performed in a vacuum. However, when the dicing sheet 55 is tensioned, because the substrate 51 is elastically deformed, the stress is added in the range in which the position relationship between the concave portions 50a and the connection electrode 28 of the semiconductor wafer 10 is not slipped, and the flexion of the dicing sheet 55 is removed.

As the alignment mark which is arranged to the substrate 51, the printing, the punch hole, the laser mark, and the like can be used, while, as the alignment mark which is arranged to the adhesive layer 50, the punch hole, and the laser mark can be suitably used. Moreover, when the alignment marks are provided at the adhesive layer 50, in the process for forming the above-mentioned concave portions 50a, the alignment mark may be formed using the formation unit for the concave portions 50a, simultaneously with the manufacturing of the concave portions 50a.

Moreover, in the case of the present embodiment, because the connection electrodes 28 are provided penetrating the semiconductor wafer 10, the concave portions 50a which are formed on the adhesive layer 50 may be used as the alignment mark, and the connection electrodes 28 may be directly positioned at the concave portions 50a.

When the lamination between the dicing sheet 55 and the semiconductor wafer 10 is finished, as shown in FIG. 1, the ring frame 69 and the semiconductor wafer 10 (work) are stored in the cassette 61 of the dicing apparatus 100. Furthermore, the work is carried out from the cassette 61 by the carrying-out mechanism 63, and is put on the temporary setting portion 62. Furthermore, the work which is put on the temporary setting portion 62 is transported on the chuck table 64 by the first transportation portion 65. Next, the ring frame 69 is fixed to the chuck table 64 by the fixed clamp (not shown in the figures) which is provided with the chuck table 64. If the chuck table 64 is fixed as such, the chuck table 64 is moved to the manufacturing position of the dicing mechanism 66.

Figure 6D:
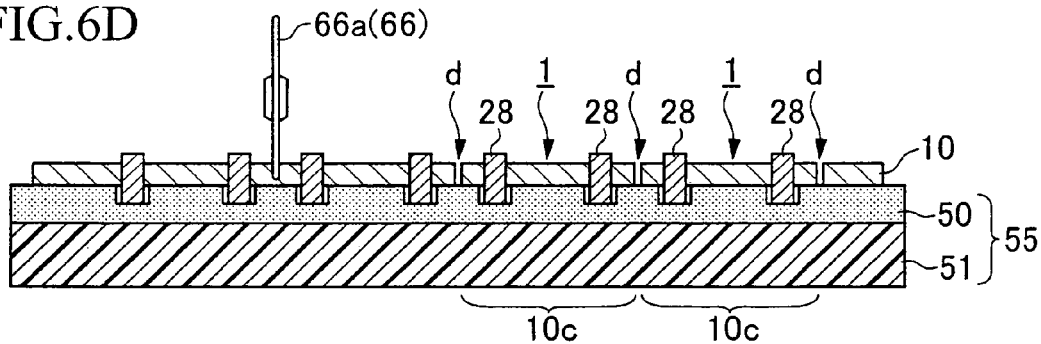
FIG. 6D is a process view which shows a manufacturing method of the dicing sheet and a dicing process.

Then, as shown in FIG. 6D, the dicing blade 66a which is provided with the dicing mechanism 66 is moved along the dicing line d shown in FIG. 4, the dicing of the semiconductor wafer 10 is performed, and thereby the semiconductor wafer 10 is divided into the individual semiconductor chips 1. Although only the semiconductor wafer 10 is cut in FIG. 6D, the adhesive layer 50 may be cut with the semiconductor wafer 10. If the adhesive layer 50 is cut in the range in which the substrate 51 is not damaged, in the case in which, at the time of exfoliating the semiconductor chip 1, when the dicing sheet 55 is expanded, and the interval of the chip is extended, the adhesion state of the semiconductor chip 1 can be suitably maintained, and the interval of the chip can be extended, and thereby only the objective chip can be surely picked up.

In the case of dicing, using two or more varieties of dicing blades of which cross-sectional shape is different from each other, two steps or more for manufacturing may be performed in the thickness direction of the semiconductor wafer 10. Cracks in the cutting surface of the semiconductor wafer 10 can thereby be effectively prevented.

If the dicing process is finished, the work is transmitted to the washing portion 68 by the second transportation portion 67, and the semiconductor wafer 10 is washed. Furthermore, the washing process is finished, the work is transmitted to the temporary setting portion 62 by the first transportation portion 65, the work which is put on the temporary setting portion 62 is returned to the predetermined position of the cassette 61 by the carrying-out mechanism 63.

In addition, in advance of the above-mentioned washing processing, the adhesive power of the adhesive layer 50 may be decreased by the ultraviolet irradiation or heating for the dicing sheet 55, while the ultraviolet irradiation process or heating process after washing may be performed.

Figure 6E:
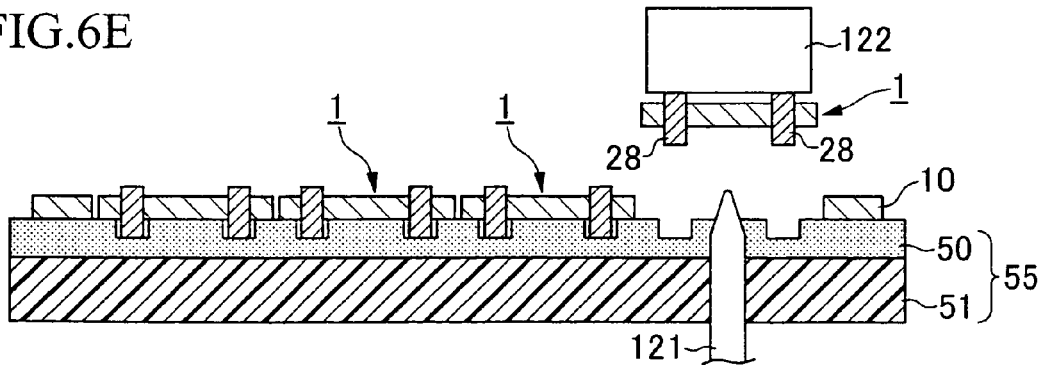
FIG. 6E is a process view which shows a manufacturing method of the dicing sheet and a dicing process.

Next, as shown in FIG. 6E, the semiconductor chip 1 after dicing is taken up from the dicing sheet 55. Concretely, a needle 121 is penetrated from the back surface side (under surface side in the figure) of the substrate 51, and one of the semiconductor chips 1 is picked up, while the semiconductor chip 1 thereof is absorbed by an adsorption collet 122 which operates synchronizing with the needle 121, and is taken out from the semiconductor wafer 10.

Even if the pickup of the semiconductor chip 1 is performed, the pickup operation can be smoothly performed by using the dicing sheet 55 according to the present invention. That is, in the dicing sheet 55 according to the present embodiment, because the concave portion 50a is formed to the adhesive layer 50 at the part corresponding to the connection electrode 28 of the semiconductor chip 1, and the projection part of the connection electrode 28 is stored in the concave portion 50a, the connection electrode 28 and the adhesive layer 50 are in a non-contact state at each other, or in a state in which only the part of the front end of the connection electrode 28 is inserted into the adhesive layer 50. Therefore, when the semiconductor chip 1 is separated from the adhesive layer 50, a defect in which the connection electrode 28 is broken into the adhesive layer 50, and is not separated from the adhesive layer 50 does not occur, and the semiconductor chip 1 can be easily separated from the dicing sheet 55 without the break of the semiconductor chip 1.

Although, in the above-mentioned embodiment, the constitution in which the concave portion 50a corresponding to each connection electrode 28 of the semiconductor wafer 10 which is adhered is formed to the adhesive layer 50 of the dicing sheet 55 is illustrated and is explained, the constitution of the dicing sheet according to the present invention is not limited to the above-mentioned embodiment.

Figure 7A:
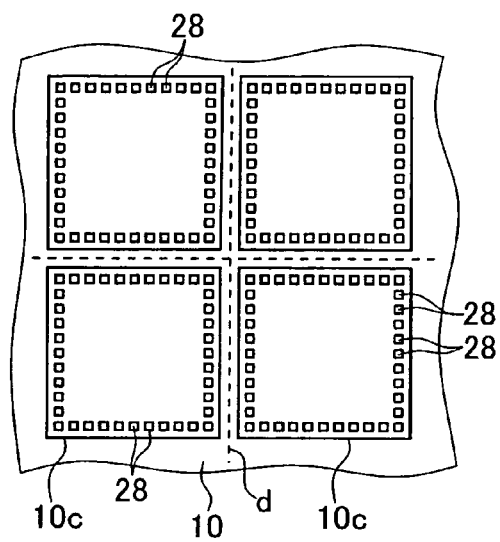
FIG. 7A is a partial plan construction view for explaining the other constitution of the dicing sheet.
Figure 7B:
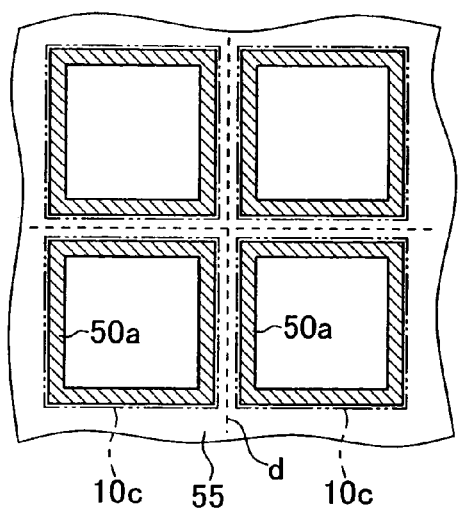
FIG. 7B is a partial plan construction view for explaining the other constitution of the dicing sheet.

For example, as shown in FIG. 7A, when the connection electrode 28 is formed to each division area 10c which is formed to the semiconductor wafer 10 at the high density, it is thought that the formation of the concave portion 50a corresponding to each connection electrode 28 for the adhesive layer 50 becomes difficult. Therefore, as shown in FIG. 7B, in order to insert a whole of connection electrodes 28 in each division area 10c at one time, the concave portion 50a of which shape is the rectangle frame shape seen from the plane surface may be formed to the adhesive layer 50.

In such a case, the dicing sheet is constituted in which the semiconductor wafer 10 can be suitably supported with adhesive, while the semiconductor chip can be easily separated after dicing.

In addition, in the present embodiment, each concave portion 50a may be arranged within the corresponding division area 10c (that is, the area which does not overlap with the dicing line d). The prevention of the chip floating or the crack at the time of dicing is the reason thereof.

(Semiconductor Apparatus)

Next, the detailed structure of the semiconductor chip 1 which is obtained by dicing the semiconductor wafer 10 shown in FIG. 3, and the manufacturing method thereof are explained with reference to the figures.

FIG. 8 is a cross-sectional view which shows a principal part of the above-mentioned semiconductor chip 1. As shown in FIG. 8, the semiconductor chip (semiconductor apparatus) 1 which is manufactured by the manufacturing method according to the present invention is composed of the silicon, and is provided with a semiconductor wafer 10 of which thickness is approximately 50 µm, and a connection electrode 28 as the penetration electrode which is provided in the penetration hole H4 formed to the semiconductor wafer 10 via the insulated film 22. Here, the penetration hole H4 is formed penetrating from the side of the active surface (upper surface side in the figure) of the semiconductor wafer 10 to the back surface side thereof (lower surface side in the figure). The integrated circuit (not shown) which is composed of the transistor, the memory element, or the other electronic element is formed to the side of the active surface of the semiconductor wafer 10, the insulated film 12 is formed on the surface of the side of the active surface thereof, and further thereon, an interlaminar insulation film 14 which is composed of a boracic acid silicic acid glass (hereinafter, which is called as BPSG), and the like is formed.

An electrode pad 16 is formed at a predetermined part of the surface of the interlaminar insulation film 14. In the electrode pad 16, a first layer 16a which is composed of Ti (titanium), and the like, a second layer 16b which is composed of TiN (titanium nitride), and the like, a third layer 16c which is composed of AlCu (aluminum/copper), and a fourth layer (cap layer) which is composed of TiN, and the like are laminated in this order.

In addition, regarding the constitution materials of the electrode pad 16, the change can be property performed according to the electrical property, the physical characteristic, and the chemical property which are needed for the electrode pad 16. For example, the electrode pad 16 may be formed by using only Al which is generally used as the electrode for integration, while the electrode pad 16 may be formed by using only copper with low electrical resistance.

Here, the electrode pad 16 is arranged in the circumference of the semiconductor chip 1, or the electrode pad 16 is arranged at the central portion thereof, and thereby the integrated circuit is not formed under the electrodes pad 16. A passivation film 18 is formed on the surface of the interlaminar insulation film 14 so that the passivation film 18 covers the electrode pad 16. The passivation film 18 is made from oxidized silicon, silicon nitride, polyimide resin, or the like, and, for example, the thickness thereof is approximately 1 μm.

Moreover, at the central portion of the electrode pad 16, an opening portion H1 of the passivation film 18 is formed, further, an opening portion H2 of the electrode pad 16 is formed. In addition, the inside diameter of the opening portion H1 is approximately 100 μm, and the inside diameter of the opening portion H2 is approximately 60 μm which is smaller than the inside diameter of the opening portion H1. On the other hand, the insulated film 20 which is composed of $SiO_2$, and the like is formed at the surface of the passivation film 18, and the inner surfaces of the opening portion H1 and the opening portion H2. By such a constitution, A hole portion H3 which penetrates the insulated film 20, interlaminar insulation film 14, the insulated film 12, and the semiconductor wafer 10 is formed to the central portion of the electrode pad 16. The inside diameter of the hole portion H3 is smaller than the inside diameter of the opening portion H2, and, for example, is formed at approximately 50 μm. In addition, in the present embodiment, the hole portion H3 is the circular shape seen from the plane surface; however, it is not limited to the above shape, for example, the hole portion H3 may be a rectangle shape seen from the plane surface.

The insulated film 22 which is composed of $SiO_2$, and the like is formed on the surface of the inner wall of the hole portion H3 and the surface of the insulated film 20. The insulated film 22 is formed in order to prevent the generation of the electrical current leak, the abrasion by oxygen, moisture, or the like, and, in the present embodiment, for example, is formed at the thickness of approximately 1 μm. Moreover, one end side of the insulated film 22 is projected from the back surface of the semiconductor wafer 10, especially, at the side in which the surface of the inner wall of the hole portion H3 is covered.

On the other hand, the insulated film 20 and the insulated film 22 which are formed on the surface of the third layer 16c of the electrode pad 16 are partially removed along the circumference edge of the opening portion H2, and a ground file 24 is formed on the surface of the third layer 16c of the electrode pad 16 which is exposed, and the surface (inner surface) of the insulated film 22. The ground file 24 is composed of a barrier layer (barrier metal) which is formed on the surface (inner surface) of the insulated film 22, or the like, and a seed layer (seed electrode) which is formed on the surface (inner surface) of the barrier layer. A object of forming the barrier layer is that the electric conduction material for forming the after-mentioned connection electrode 28 is diffused to the semiconductor wafer 10, and the barrier layer is formed from TiW (titanium tungsten), TiN (titanium nitride), or the like. On the other hand, the seed layer becomes the electrode in the case of forming the after-mentioned connection electrode 28 by plating process, and is made from Cu, Au (gold), Ag (silver), or the like.

The connection electrode 28 which is composed of the electric conduction material with low electric resistance such as Cu, W, or the like is formed at the inside of such ground file 24 in the state in which the connection electrode 28 is embedded in a penetration hole H4 which is composed of the opening portion H1, the opening portion H2, and the hole portion H3.

In addition, as the electric conduction material which forms the connection electrode 28, the material in which impurities such as B (boron), P (phosphorus), or the like is doped in polysilicon can be used, in the case in which the electric conduction material is formed by using the above material, because it is necessary for the diffusion of the metal for the semiconductor wafer 10 to be prevented, the formation of the barrier layer is not needed.

Moreover, at P1 portion in FIG. 8, the connection electrode 28 and the electrode pad 16 are connected to each other. The end portion at the back surface side of the semiconductor wafer 10 of the connection electrode 28 is projected against the back surface of the semiconductor wafer 10, moreover, the end surface at the lower end portion thereof is exposed to the outside. In addition, the insulated film 22 is arranged in the circumference of the connection electrode 28, and one end side of the insulated film 22 is in the state of projecting from the back surface of the semiconductor wafer 10.

On the other hand, the connection electrode 28 is formed projecting from the active surface side of the semiconductor wafer 10, the outside diameter of the projecting part thereof is larger than the outside diameter of the insulated film 22 which is projected from the above-mentioned back surface side, and, in the present embodiment, the connection electrode 28 is formed as the circular shape seen from the plane surface or the regular square shape, or the like. The concave portion 30 is formed at the front end portion of the part projecting from the active surface side, and the solder 32 as the wax material is formed so that the concave portion 30 is embossed. Concretely, the solder 32 is lead-free solder.

The depth of the concave portion 30 which is formed at the front end portion of the connection electrode 28 is set so that the depth of the concave portion 30 thereof is smaller than the amount of projection from the back surface of the semiconductor wafer 10 of the connection electrode 28. In other words, the amount of projection from the back surface of the semiconductor wafer 10 of the connection electrode 28 is set so that the amount of projection thereof is larger than the depth of the concave portion 30. For example, when the height of the connection electrode 28 (the part which is projected from the ground file 24) is approximately 20 μm, and the depth of the concave portion 30 is approximately 10 μm, the amount of the projection from the back surface of the semiconductor wafer 10 of the connection electrode 28 is set at approximately 20 μm. By setting the depth of the concave portion 30 as such, when a plurality of semiconductor chips 1 are laminated, even if the front end portion (front end portion of the part projecting from the back surface side of the semiconductor wafer 10) of the connection electrode 28 which is formed to the laminated semiconductor chip 1 becomes the state of being in contact with the bottom most portion of the concave portion 30, the solder 32 will not adhere to the back surface of the laminated semiconductor chip 1.

(Manufacturing Method of the Semiconductor Apparatus)

Next, the manufacturing method of the semiconductor chip 1 (semiconductor wafer 10) of which the constitution above-mentioned is explained. FIG. 9A to FIG. 14 are process views which show an example of the manufacturing procedure of the semiconductor apparatus according to one embodiment of the present invention. Hereinafter, an example of the manufacturing procedure is explained with reference to these figures in order.

In addition, although in general the shape of the semiconductor chip is a rectangular parallelepiped (including a regular hexahedron), it is not limited to the above, for example, the shape of the semiconductor chip may be a spherical shape.

Figure 9A:
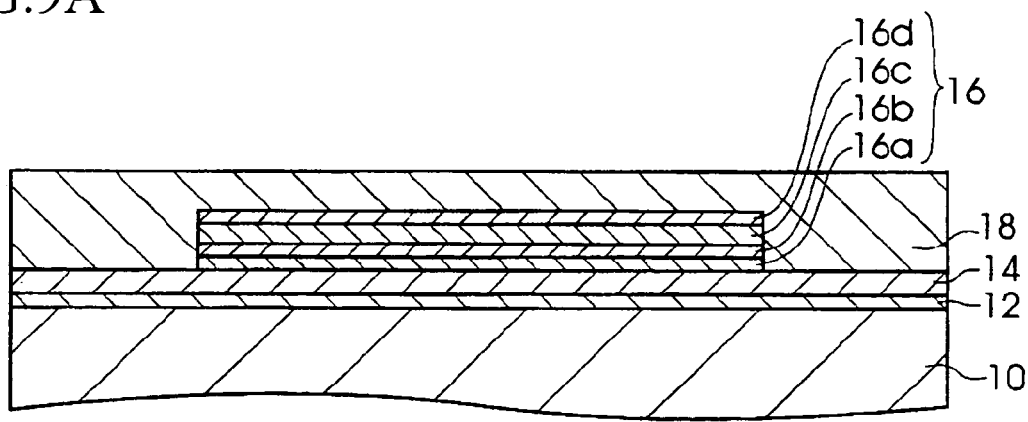
FIG. 9A is a cross-sectional process view which shows the manufacturing process of the semiconductor chip according to the present embodiment.

First, the constitution of the semiconductor wafer which is the processed object is explained. FIG. 9A is a cross-sectional view which shows a part of the semiconductor wafer used for manufacturing the semiconductor chip according to the present embodiment. In FIG. 9A, the insulated film 12 is formed on the surface (active surface) of the semiconductor wafers 10 such as Si (silicon) in which the integrated circuit which is composed of the transistor, the memory element, the other electronic element, and the like (not shown in the figures) is formed.

The insulated film 12 is formed with the oxide film ($SiO_2$) of Si (silicon) which is the basic material of the semiconductor substrate which constitutes, for example, the semiconductor wafer 10. The interlaminar insulation film 14 which is composed of BPSG is formed on the insulated film 12. The electrode pad 16 which is electrically connected to the integrated circuit which is formed to the semiconductor wafer 10 at the part which is not shown in the figures is formed on the interlayer insulation film 14. In the electrode pad 16, a first layer 16a which is composed of Ti (titanium), a second layer 16b which is composed of TiN (titanium nitride), a third layer 16c which is composed of AlCu (aluminum/copper), and a fourth layer (cap layer) which is composed of TiN are laminated in this order.

The electrode pad 16 is formed by the method in which the laminated layer structure which is composed of the first layer 16a to the fourth layer 16b is formed on a whole of the interlayer insulation film 14 by, for example, sputtering, and the patterning of the laminated layer structure thereof for the predetermined shape (for example, the circular sharp seen from the plane surface) is performed using the resist, or the like. In addition, in the present embodiment, an example in the case in which the electrode pad 16 is formed with the above-mentioned laminated layer structure is explained. However, the structure of the electrode pad 16 is not limited to the above structure, and although the electrode pad 16 may be formed from only Al which is generally used as the electrode of integrated circuit, it would be desirable for the electrode pad 16 to be formed using copper with low electric resistance. Moreover, the structure of the electrode pad 16 is not limited to the above constitution, and may be suitably changed according to the electrical property, the physical characteristic, and the chemical property which are needed.

The electrode pad 16 is formed standing along at least one side (in many cases, two sides or four sides) among surfaces of a plurality of semiconductor chip areas which are formed at the semiconductor wafer 10. Moreover, in one case, the electrode pad 16 is formed along the side of the surface of each semiconductor chip area, and in another case, the electrode pad 16 is formed along the central portion. In addition, the constitution in which the electronic circuit is not formed at the lower part of the electrode pad 16 must be considered. The passivation film 18 is formed on the interlayer insulation film 14 so that the passivation film 18 covers the electrode pad 16. The passivation film 18 is formed from $SiO_2$ (oxidized silicon), SiN (silicon nitride), polyimide resin, or the like. In addition, the thickness of the passivation film 18 is, for example, approximately 1 μm.

Next, each process which is performed for the substrate of which constitution as above-mentioned is explained in order. First, the resist (not shown in the figures) is coated on a whole surface of the passivation film 18 by a method such as the spin coat method, the dipping method, the spray coat method, or the like. In addition, the resist is used for opening the passivation film 18 which covers the upper part of the electrode pad 16, and the resist may be either of photo resist, electron beam resist, and X-ray resist, and may be positive type or negative type.

Figure 9B:
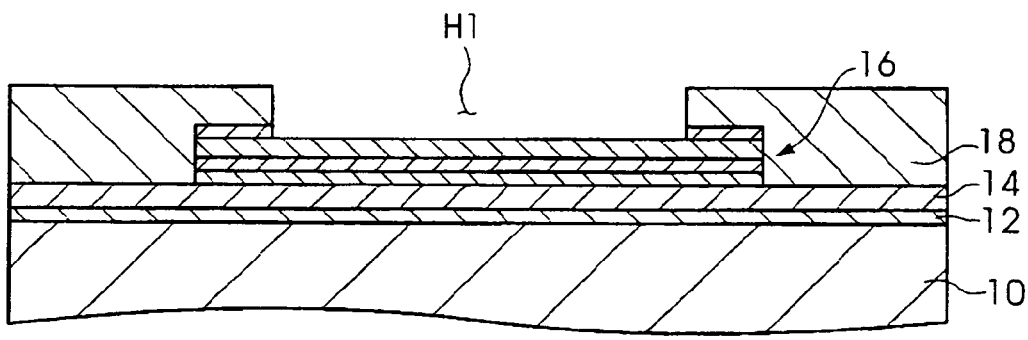
FIG. 9B is a cross-sectional process view which shows the manufacturing process of the semiconductor chip according to the present embodiment.

When the resist is coated on the passivation film 18, after the prebake is performed, the exposing process and the developing process are performed using the mask on which the predetermined pattern is formed, and the patterning of the resist for the predetermined shape is performed. In addition, the shape of the resist is set according to the opening shape of the electrode pad 16 and the cross-sectional shape of the hole which is formed to the semiconductor wafer 10. When the patterning of the resist is finished, after performing the postbake, as shown in FIG. 9B, a part of the passivation film 18 which covers the electrode pad 16 is etched, and the opening portion H1 is formed. In addition, in the present embodiment, the fourth layer 16d which constitutes a part of the electrode pad 16 is etched with the passivation film 18. For example, the diameter of the opening portion H1 is approximately 100 μm. FIG. 9B is a cross-sectional view which shows the state in which the passivation film 18 is opened, and thereby the opening portion H1 is formed.

In addition, it would be desirable to apply the dry etching as the etching. The dry etching may be RIE (Reactive Ion Etching). Moreover, the wet etching may be applied as the etching. After forming the opening portion H1 to the passivation film 18, the resist on the passivation film 18 is separated with separation liquid.

When the above-mentioned process is finished, the resist (now shown in the figures) is coated on a whole surface of the passivation film 18 on which the opening portion H1 is formed, and, after the patterning of the resist of which the shape is the opening shape on the electrode pad 16 which is exposed on the opening portion H1 is performed, and the postbake is performed, the electrode pad 16 is opened by the dry etching.

Figure 9C:
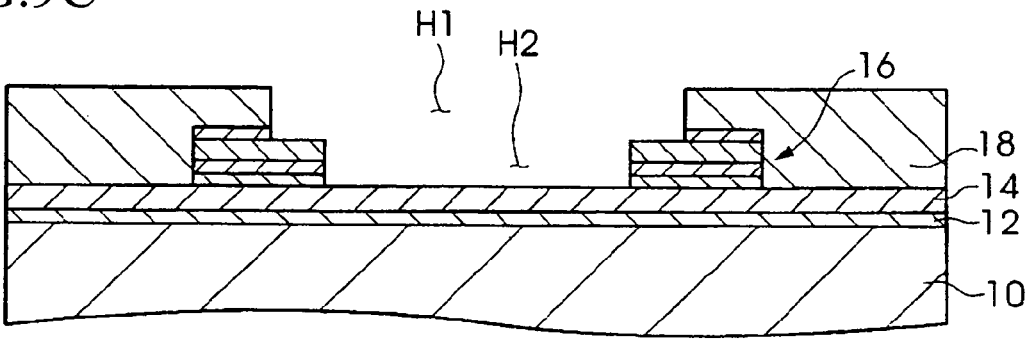
FIG. 9C is a cross-sectional process view which shows the manufacturing process of the semiconductor chip according to the present embodiment.
Figure 10A:
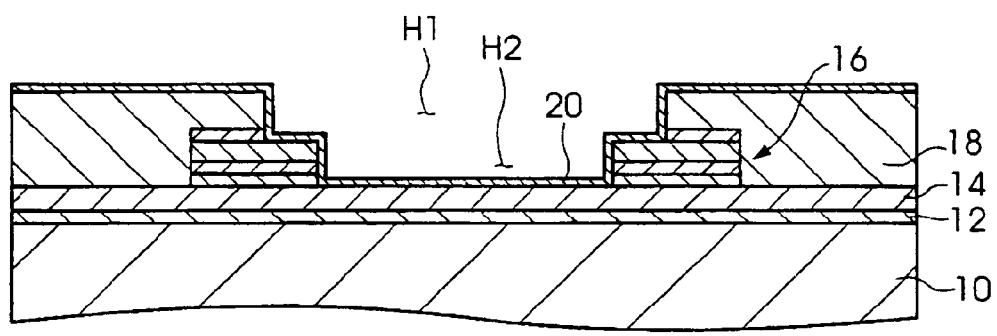
FIG. 10A is a cross-sectional process view which shows the manufacturing process of the semiconductor chip according to the present embodiment.

FIG. 9C is a cross-sectional view which shows the state in which the electrode pad 16 is opened, and thereby the opening portion H2 is formed. As shown in FIG. 9C, in the present embodiment, the opening diameter (approximately 60 μm) of the opening portion H2 which is formed to the electrode pad 16 is smaller than the diameter of the opening portion H1 which is formed to the passivation film 18. In addition, RIE can be used as the dry etching which is used when opening the electrode pad 16. When the opening portion H2 is formed to the electrode pad 16, the resist is separated with separation liquid, and the following process is carried out. When the above-mentioned process is finished, the insulated film 20 is formed on the interlayer insulation film 14 which is exposed on the opening portion H2, the electrode pad 16, and the passivation film 18 which is positioned at the upper part of the electrode pad 16. FIG. 10A is a cross-sectional view which shows the state in which the insulated film 20 is formed on the interlayer insulation film 14, the electrode pad 16, and the passivation film 18 which is positioned at the upper part of the electrode pad 16.

The insulated film 20 functions as the mask for the dry etching in the case of boring the after-mentioned semiconductor wafer 10, and, although $SiO2$ was used for the present embodiment, if the selection ratio with Si is proper, the photoresist may be used. Furthermore, the film thickness thereof may be arbitrarily set according to the depth of boring.

In addition, in the case of using the insulated film, for example, Tetra Ethyl Ortho Silicate: $Si(OC_2H_5)_4$: hereinafter, which is called as TEOS which is made using PECVD (Plasma Enhanced Chemical Vapor Deposition), that is, PE-TEOS, TEOS which is made using Ozone CVD, that is, $O_3$-TEOS, or silicon oxide which is made using CVD can be used. In addition, the thickness of the insulated film 20 is, for example, approximately 2 μm.

Figure 10B:
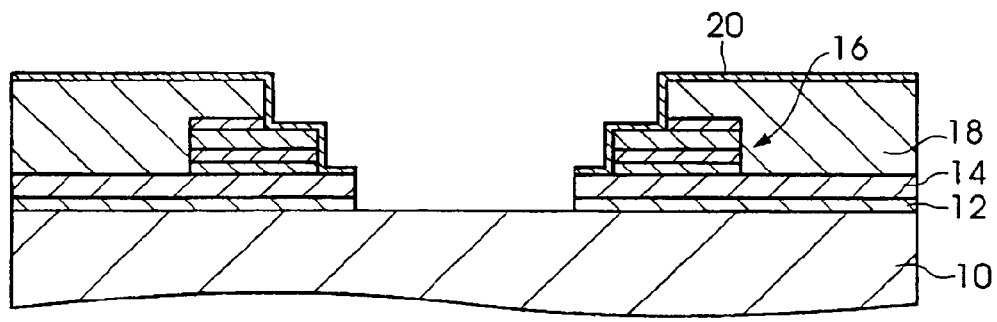
FIG. 10B is a cross-sectional process view which shows the manufacturing process of the semiconductor chip according to the present embodiment.

Then, the resist (not shown in the figures) is coated on a whole surface of the semiconductor substrate which is shown in FIG. 10A, and, after the patterning of the resist of which shape is the opening shape on the insulated film 20 which is formed on the interlayer insulation film 14 is performed, a part of the insulated film 20, the interlayer insulation film 14, and the insulated films 12 is etched, and, as shown in FIG. 10B, the surface of the semiconductor wafer 10 is exposed. FIG. 10B is a cross-sectional view which shows the state in which a part of the insulated film 20, the interlayer insulation film 14, and the insulated films 12 is etched, and a part of the semiconductor wafer 10 is exposed.

Figure 11A:
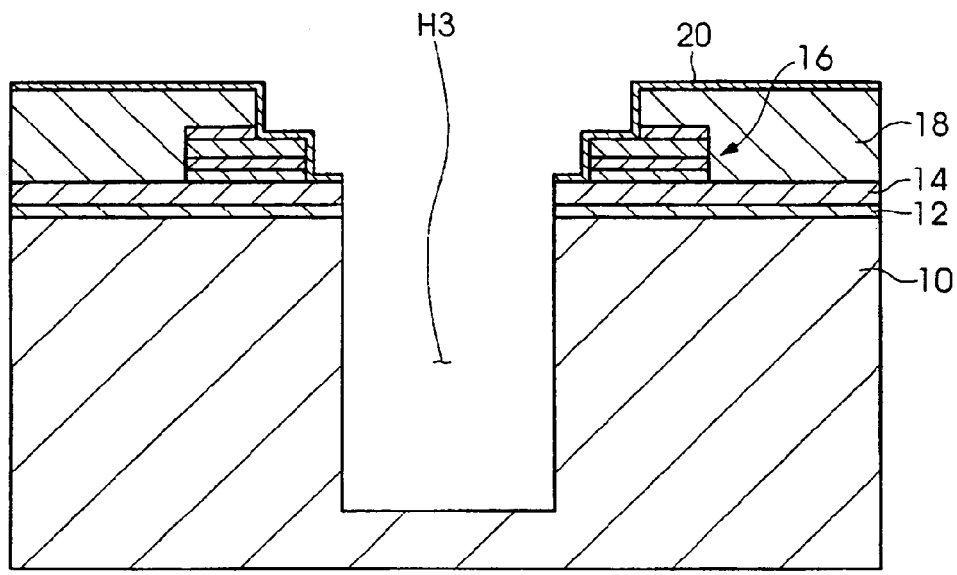
FIG. 11A is a cross-sectional process view which shows the manufacturing process of the semiconductor chip according to the present embodiment.

When the above-mentioned process is finished, as shown in FIG. 11A, the semiconductor wafer 10 is bored. In addition, here, RIE or ICP (Inductively Coupled Plasma) can be used as the dry etching. In this case, although the insulated film 20 which is formed at the above-mentioned backside process becomes the mask, the resist may be used instead of the insulated film 20. FIG. 11A is a cross-sectional view which shows the state in which the semiconductor wafer 10 is bored, and thereby the hole portion H3 is formed. As shown in FIG. 11A, the diameter (approximately 50 μm) of the hole portion H3 which is formed to the semiconductor wafer 10 is smaller than the diameter of the opening portion which is formed to the electrode pad 16. In addition, the depth of hole portion H3 is suitably set according to the thickness of the semiconductor chip which is finally formed.

Figure 11B:
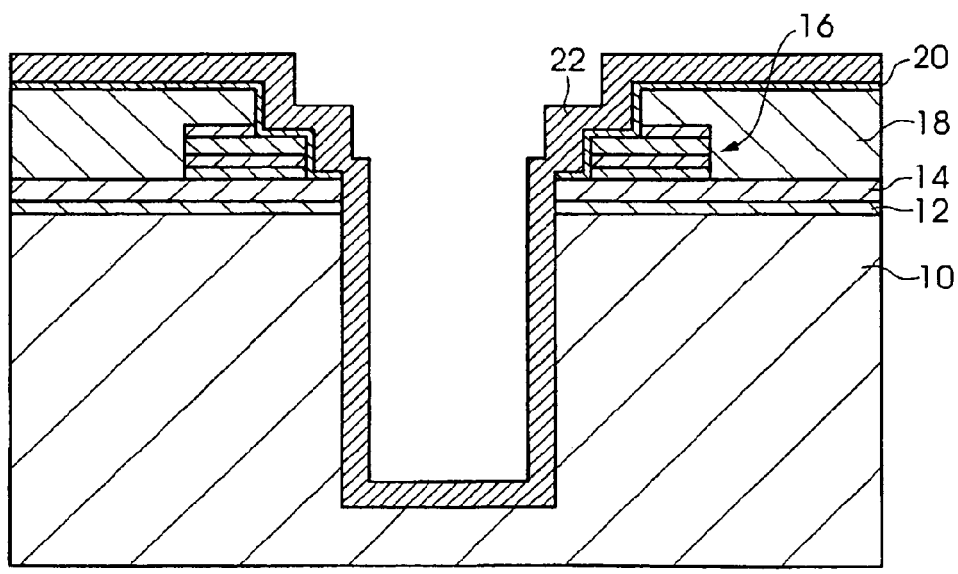
FIG. 11B is a cross-sectional process view which shows the manufacturing process of the semiconductor chip according to the present embodiment.

When the formation of the hole portion H3 is finished, the insulated film 22 is formed on the insulated film 20 (the upper portion of the electrode 16), and on the inner wall and the bottom surface of the hole portion H3. FIG. 11B is a cross-sectional view which shows the state in which the insulated film 22 is formed on the insulated film 20 (the upper portion of the electrode 16), and on the inner wall and the bottom surface of the hole portion H3. The insulated film 22 is provided in order to prevent the generation of the electrical current leak, the abrasion by oxygen, moisture, or the like, etc. The insulated film 22 is formed using the chemistry gas phase propagation method such as PE-CVE, ozone CVD which uses the ozone plasma, or the like.

Figure 12A:
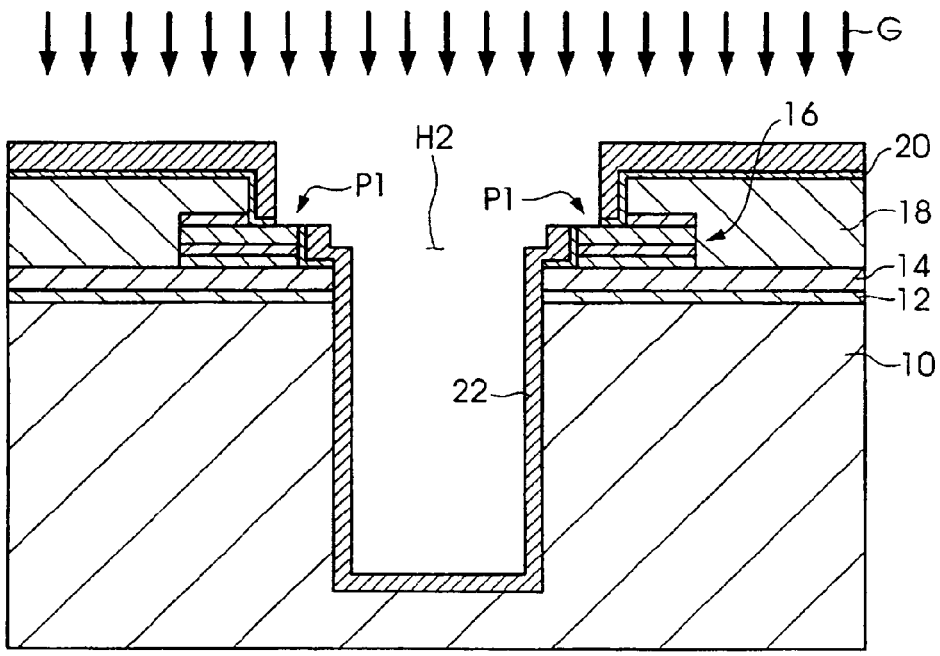
FIG. 12A is a cross-sectional process view which shows the manufacturing process of the semiconductor chip according to the present embodiment.

Then, the process for performing the anisotropic etching for the insulated film 22 which is formed at the above-mentioned process is performed. The process thereof is performed in order to remove a part of the insulated films 20 and the insulated films 22 which are formed at the upper portion of the electrode pad 16, and to expose a part of the electrode pads 16. In addition, here, the dry etching such as RIE, or the like is suitably used as the anisotropic etching which is carried out for the insulated film 22. FIG. 12A is a view which shows the process for performing the anisotropic etching for the insulated film 22. As shown in FIG. 12A, the dry etching due to RIE, or the like is performed for a whole surface of the semiconductor substrate on which the resist is not coated. In addition, in FIG. 12A, symbol G shows the reactive gas which enters into the semiconductor substrate by the dry etching.

Because the reactive gas G enters in the approximate perpendicular direction against the surface of the semiconductor wafer 10 (or, the contact surface of the insulated film 12, an interlayer insulation film 14, the passivation film 18, or the like), the etching in the entering direction of the reactive gas G is promoted. As a result, in FIG. 12A, the insulated film 20 and the insulated film 22 at a part (a part along the circumference of a circle of the opening portion H2) to which symbol P1 is attached are removed, and a part of the electrode pads 16 is exposed. In addition, in this case, instead of etching the whole constitution, the patterning and the etching using the resist may be performed so that only the part in which the electrical connection is needed is opened, that is, only P1 portion in FIG. 12A is opened.

When the above-mentioned process is finished, the process in which the ground film 24 is formed on the bottom surface of the hole portion H3, and the inner wall and the upper portion of the insulated film 22 is performed. The ground film 24 is composed of a barrier layer and a seed layer, first, after the barrier layer is formed, the seed layer is formed on the barrier layer, and thereby the formation of the ground film 24 is finished. Here, the barrier layer is made from, for example, TiW or TiN, and the seed layer is made from Cu. The barrier layer and the seed layer are formed using, for example, IMP (ion metal plasma) method, PVD (Physical Vapor Deposition) method such as vacuum evaporation method, sputtering method, and ion plating method, or the like, or CVD method.

Figure 12B:
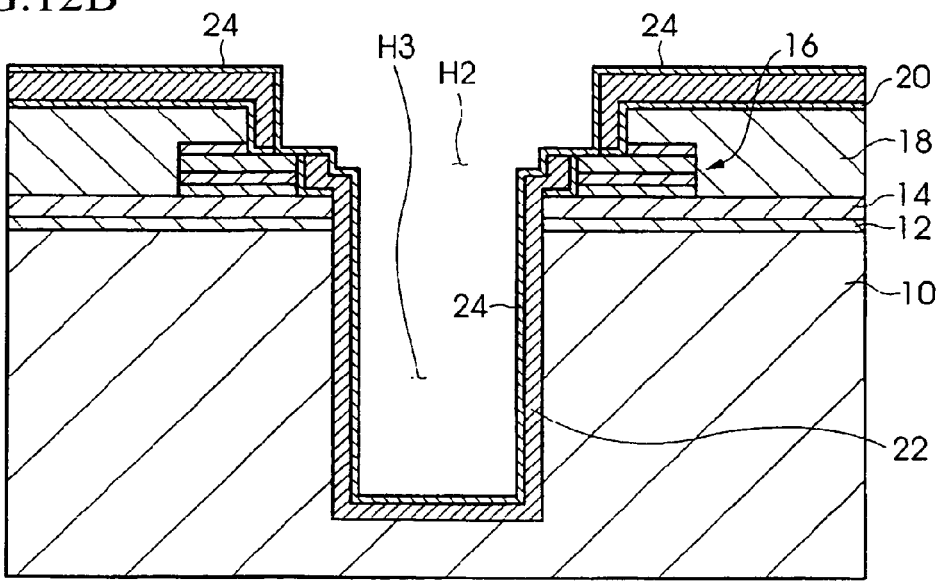
FIG. 12B is a cross-sectional process view which shows the manufacturing process of the semiconductor chip according to the present embodiment.

FIG. 12B is a cross-sectional view which shows the state in which the ground film 24 is formed. As shown in FIG. 12B, the ground film 24 is successively formed from the opening portion H2 which is formed to the electrode pad 16 to the inner wall of the hole portion H3 which is formed to the semiconductor wafer 10. Moreover, the ground film 24 is formed on the side wall of the insulated film 22 which is formed at the upper part of the electrode pad 16, and on the insulated film 20. In addition, the film thickness of the barrier layer which constitutes the ground layer 24 is, for example, approximately 100 nm, and the film thickness of the seed layer is, for example, several hundreds of nm.

When the formation of the ground film 24 is finished, the plating resist is coated over the whole surface on the ground film 24, the patterning of the plating resist for the shape in which the part where the hole portion H2 is formed is opened is performed, and the plating resist pattern 26 is formed. At this time, the diameter (for example, approximately 120 μm) of the opening portion which is formed to the plating resist 26 is larger than the diameter of the hole portion H2. When the plating resist pattern 26 is formed, using the electrochemistry plating (ECP) method, as shown in FIG. 13A, the process is performed in which the plating process is performed at the inner portion of the hole portion H3 and at the upper portion of the electrode pad 16, and the inner portion of the hole portion H3 is embedded with copper, while the connection electrode 28 of which shape is that projecting from the electrode pad 16 is formed.

Figure 13A:
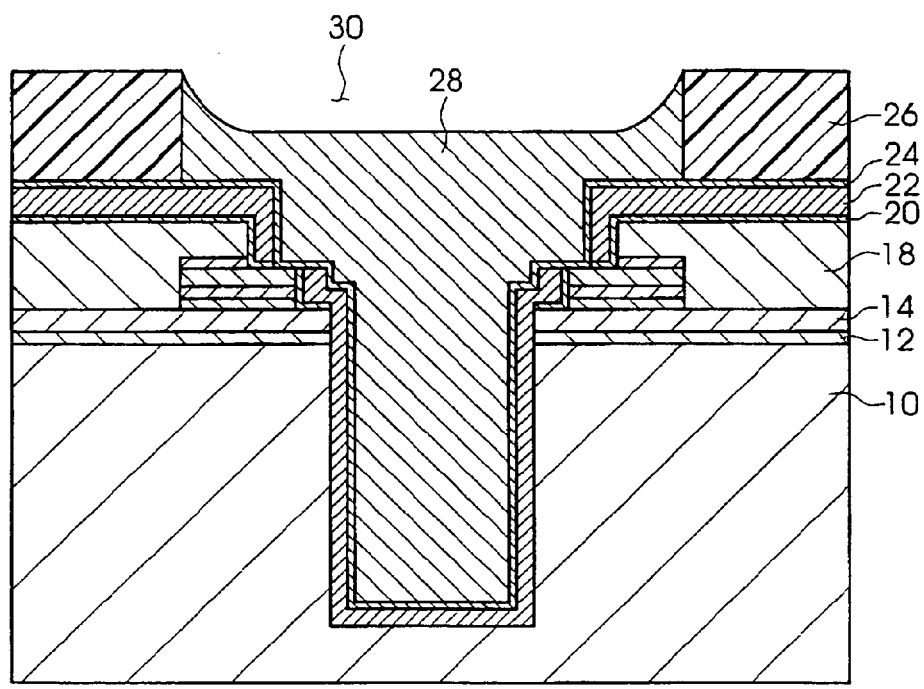
FIG. 13A is a cross-sectional process view which shows the manufacturing process of the semiconductor chip according to the present embodiment.

FIG. 13A is a cross-sectional view which shows the state in which the connection electrode 28 is formed. Here, because, when the plating process is performed, it is necessary for the inner portion of the hole portion H3 to be embedded with copper, as shown in FIG. 13A, the upper surface of the connection electrode 28 is not flat, and is the shape in which the central portion thereof is fallen in, and the concave portion 30 is formed. If the method such as CMP (chemical mechanical polishing) method, or the like is used, the upper surface of the connection electrode 28 can be flattened, however, in the present embodiment, the concave portion 30 is positively used in order to improve the reliability of the semiconductor apparatus. In addition, although the depth of the concave portion 30 is determined according to the diameter and the height of the connection electrode 28, the diameter of the hole portion H3, and the like, for example, when the height (the part projecting from the ground film 24) of the connection electrode 28 is approximately 20 μm, the depth of the concave portion 30 is approximately 10 μm.

When the plating process of copper is finished, the solder plating is performed using the plating resist pattern 26 as the mask in itself, and thereby the process for forming the solder on the concave portion 30 of the connection electrode 28 is performed.

Figure 13B:
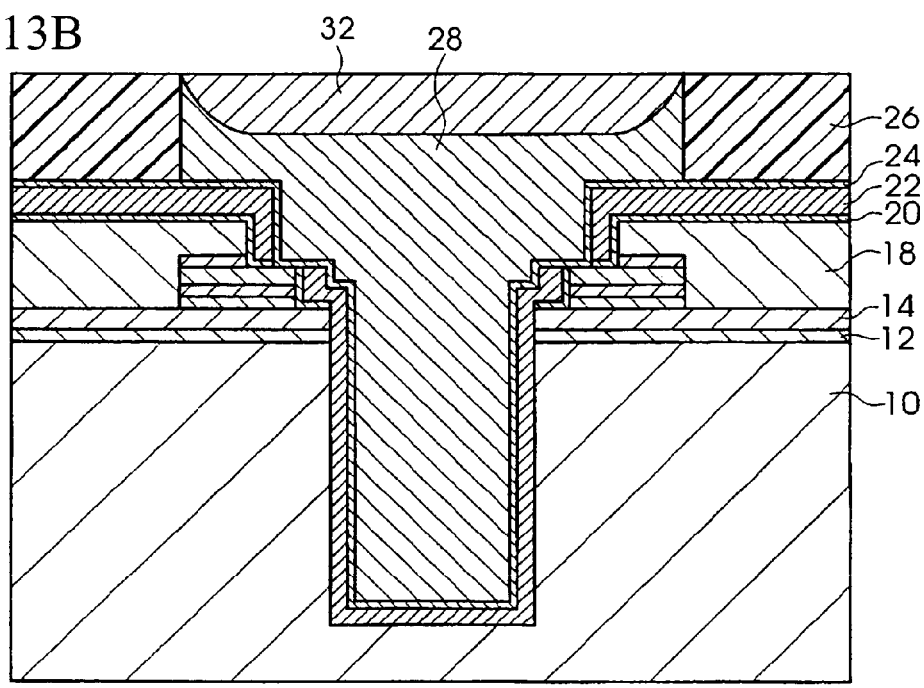
FIG. 13B is a cross-sectional process view which shows the manufacturing process of the semiconductor chip according to the present embodiment.

FIG. 13B is a cross-sectional view which shows the state in which the solder 32 is formed on the concave portion 30 of the connection electrode 28. As shown in FIG. 13B, the amount of the solder 32 is set to the amount of the extent in which the concave portion 30 is exactly embedded, that is, to the approximate same amount as the capacity of the concave portion 30. In addition, the amount of the solder 32 may be slightly larger than the capacity of the concave portion 30, or the amount of the solder 32 may be slightly smaller than the capacity of the concave portion 30. However, when the solder 32 is melted (wet backed), the amount of the solder 32 may be set at the extent in which the solder 32 is filled up until the struck measure of the concave portion 30, or at the extent in which the solder 32 is not slightly filled up until the struck measure thereof. Moreover, in order to reduce the load on the environment, it is desirable to use the lead-free solder as the solder 32.

Figure 14:
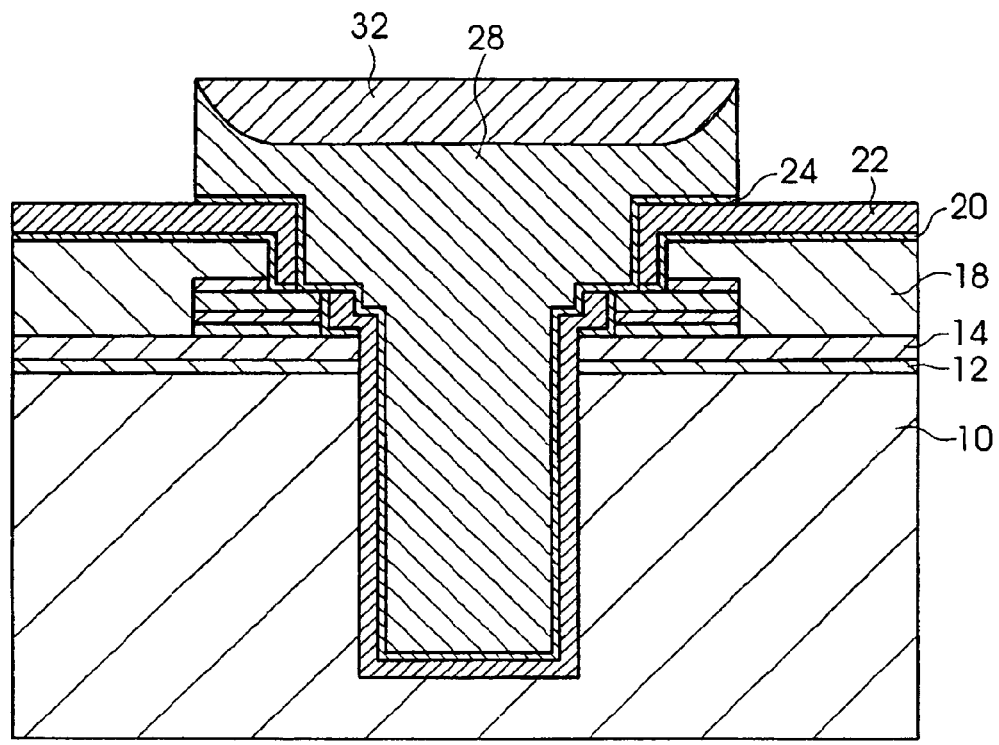
FIG. 14 is a cross-sectional process view which shows the manufacturing process of the semiconductor chip according to the present embodiment.

After the formation of solder 32 for the concave portion 30 is finished, the plating resist pattern 26 is separated using the separation liquid, or the like, and the plating resist pattern 26 is removed. In addition, for example, ozone water is used as separation liquid. Then, the process is performed in which the unnecessary portion of the ground film 24 which is used for forming the connection electrode 28 is removed. FIG. 14 is a cross-sectional view which shows the state in which the separation of the plating resist pattern 26 and the removing of the unnecessary portion of the ground film 24 are performed. Here, the unnecessary portion of the ground film 24 is, for example, the portion which is exposed to the surface.

Because the ground film 24 is the film which has conductivity, in the state which is shown in FIG. 13B, the whole of connection electrodes 28 which are formed to the semiconductor wafer 10 by the ground film 24 are in the state of being conducted electrically. For the above reason, the unnecessary portion of the ground film 24 is removed, and individual connection electrode 28 is insulated. The concrete method of removing the ground film 24 is that, for example, the resist film is formed to the whole surface at the side of the active surface of the semiconductor wafer 10, then, the patterning of the resist film thereof for the shape of the connection electrode 28 is performed. Next, the dry etching of the ground film 24 is performed with the mask of the resist pattern thereof.

By the above-mentioned process, the process for the side of the active surface is finished, next, the process for the side of the back surface of the semiconductor wafer 10 is performed. The process for the side of the back surface of the semiconductor wafer 10 is the process for which the semiconductor wafer 10 becomes the thin shape. In order that the semiconductor wafer 10 becomes the thin shape, the semiconductor wafer 10 is turned over in the upper and lower direction, the reinforcement member (not shown in the figures) is adhered at the side of the active surface of the semiconductor wafer 10 which is the lower side in the above state.

Although the elasticity material such as a resin film, or the like can be used as the reinforcement member, a hard material such as glass, or the like is suitably used, especially, in view of performing the reinforcement mechanically.

By adhering such a hard reinforcement member to the side of the active surface of the semiconductor wafer 10, the camber of the semiconductor wafer 10 can be reformed, and moreover, when the back surface of the semiconductor wafer 10 is manufactured, or when the handling is performed, the occurrence of the crack for the semiconductor wafer 10 can be prevented. The attachment of the reinforcement member can be, for example, performed using adhesive. As the adhesive, the thermosetting type of adhesive or the optical hardenability type of the adhesive is suitably used. By using such an adhesive, roughness at the side of the active surface of the semiconductor wafer 10 can be smoothed, and the reinforcement member can be steady fixed to the semiconductor wafer 10. Moreover, especially, when the ultraviolet hardening type of adhesive is used as the adhesive, transparent material such as glass, or the like may be adopted as the reinforcement member. By such a constitution, the adhesive can be easily hardened by emitting the light from the outside of the reinforcement member.

Next, the thickness of the semiconductor wafer 10 becomes approximately 50 μm by etching the whole surface of the back surface of the semiconductor wafer 10, and thereby the connection electrode 28 in the state of being covered with the insulated film 22 is projected from the back surface. As the etching at this time, either wet etching or dry etching can be used. As the wet etching, for example, the wet etching in which, for example, the mixed liquid of hydrogen fluoride (HF) and nitric acid ($HNO_3$) is used as etchant can be adopted. When the dry etching is adopted, for example, inductively coupled pasma (ICP), or the like can be used. In addition, in advance of etching, the back surface of the semiconductor wafer 10 is ground (roughly ground) until just before the insulated film 22 or the connection electrode 28 is exposed, and then, the above-mentioned etching is suitably performed. By such a method, the processing time is decreased, and the productivity can be improved. The front end portion of the connection electrode 28 is ground or is subjected to dry etching, and thereby the insulated film 22 and the ground film 24 are removed, and a conductor portion is exposed to the front end of the connection electrode 28. When using the dry etching, the above process can be performed in the process of projecting the connection electrode 28 from the back surface at the same time.

Then, the adhesive at the side of the active surface of the semiconductor wafer 10 is dissolved with a solvent, or the like, and the reinforcement member (not shown in the figures) which is attached to the side of the active surface of the semiconductor wafer 10 is removed. Moreover, according to the type of the adhesives, the ultraviolet ray, laser light, or the like is emitted into the adhesive, thereby the adhesiveness (or, the cohesion) thereof is lost, and the reinforcement member may be removed. Next, the dicing sheet (not shown in the figures) is attached to the back surface of the semiconductor wafer 10, the dicing of the semiconductor wafer 10 is performed in the state thereof, and thereby the semiconductor chip 1 is divided into each piece. The dicing process thereof is performed by the above-mentioned dicing method.

Figure 15:
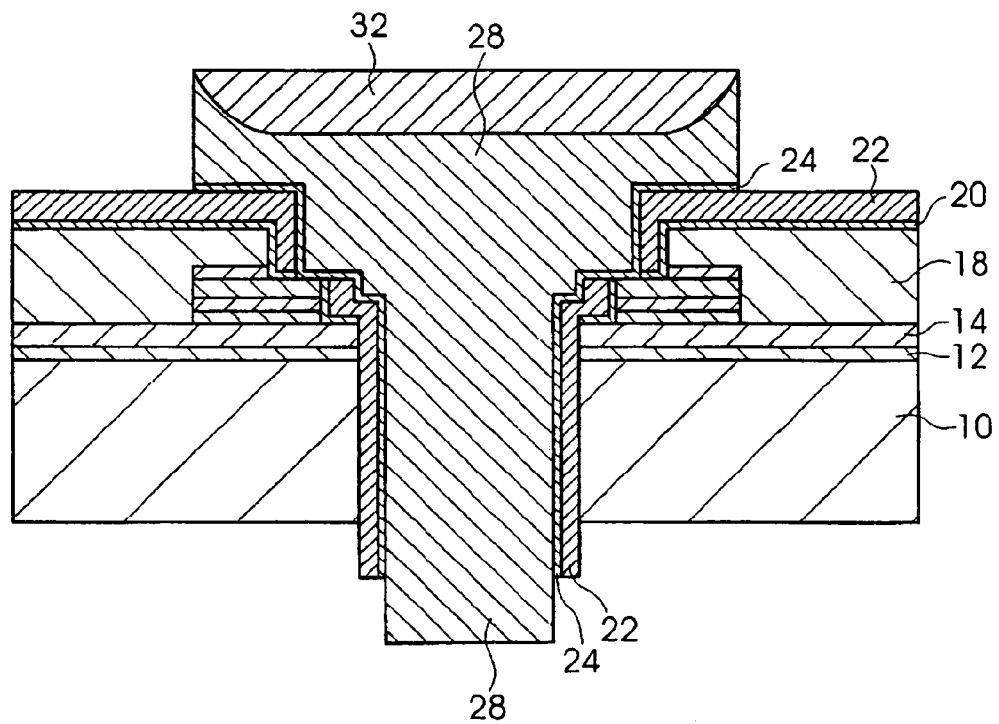
FIG. 15 is a cross-sectional view which shows the other constitution of the semiconductor chip.

The semiconductor chip 1 shown in FIG. 8 is obtained by the above method. In addition, the constitution of the semiconductor chip 1 shown in FIG. 8 is that, in the back surface of the semiconductor wafer 10, the side surface of the connection electrode 28 is covered with the ground film 24 and the insulated film 22, and only the front end portion of the connection electrode 28 is exposed; however, as shown in FIG. 15, the side surface of the connection electrode 28 may be exposed. FIG. 15 is a cross-sectional view which shows the other constitution of the semiconductor chip 1. As shown in FIG. 15, the ground film 24 and the insulated film 22 are projected from the back surface of the semiconductor wafer 10 until the intermediate position of the exposed portion from the back surface of the connection electrode 28, and the conductor is exposed at the side surface portion near the front end portion of the connection electrode 28. Removal of the insulated film 22 and the ground film 24 can be performed at the same process as the etching processing of the back surface of the above-mentioned semiconductor wafer 10. Moreover, such a shape can be formed by processing while combining the wet etching and the dry etching.

(Semiconductor Apparatus which has the Laminated Structure)

Figure 16:
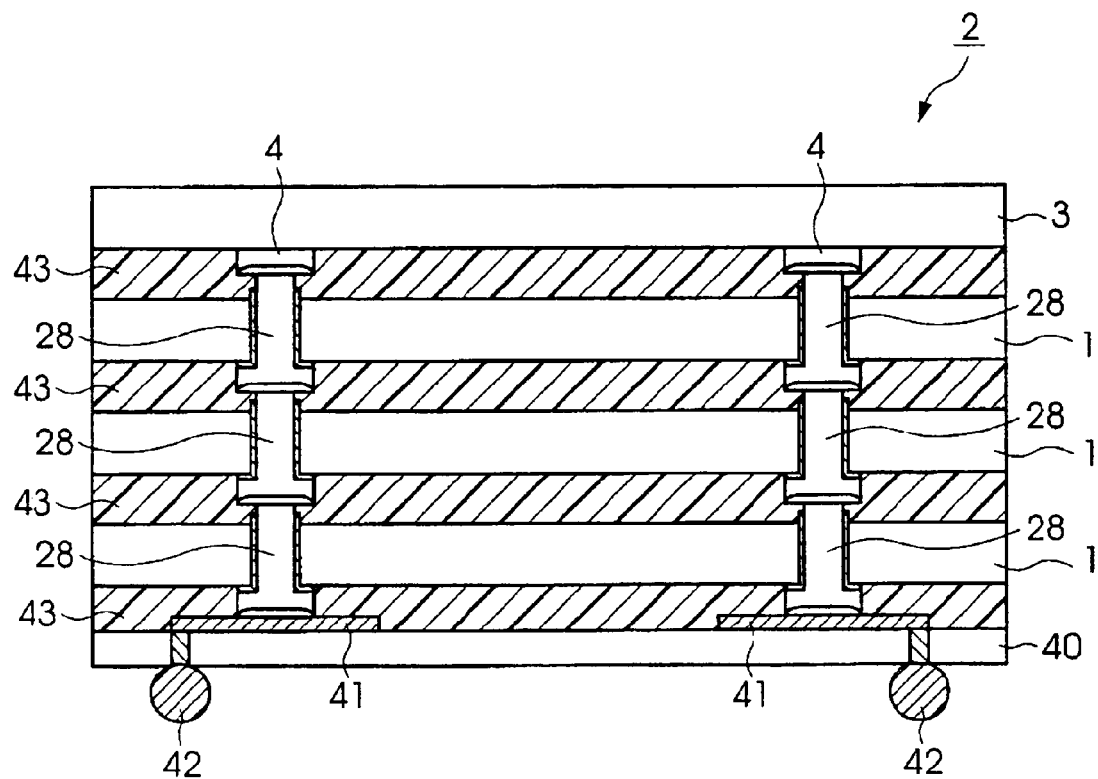
FIG. 16 is a cross-sectional view of the semiconductor apparatus in which three-dimensional mounting is carried out by laminating the semiconductor chip.

As mentioned above, although the semiconductor chip 1 which has the connection electrode 28, and the manufacturing method thereof are explained above, next, the semiconductor apparatus which has the laminated structure in which the semiconductor chip 1 which is obtained as mentioned above is laminated is explained. FIG. 16 is a cross-sectional view which shows the semiconductor apparatus 2 in which the semiconductor chip 1 is laminated, and three dimensional mounting is performed. In the semiconductor apparatus 2, a plurality (three layers in FIG. 16) of semiconductor chips 1 are laminated on an interposer substrate 40, further thereon, a different type of semiconductor apparatus 3 is laminated.

Wiring 41 is formed on the upper surface of the interposer substrate 40, moreover, the solder ball 42 which is electrically connected to the wiring 41 is provided on the lower surface of the interposer substrate 40. The semiconductor chip 1 is laminated on the upper surface of the interposer substrate 40 via the above-mentioned wiring 41. That is, in the semiconductor chip 1, the part projecting from the side of the active surface of the connection electrode 28 is connected to the above-mentioned wiring 41 with the solder 32 which is formed in the concave portion of the front end portion thereof, thereby, the semiconductor chip 1 is laminated on the interposer substrate 40. Moreover, the insulated underfilm 43 is filled in between the interposer substrate 40 and the semiconductor chip 1, thereby, the semiconductor chip 1 is stably held and fixed on the interposer substrate 40, while the semiconductor chip 1 is insulated at the part other than the junction between the electrodes.

Moreover, the part projecting from the side of the active surface of the connection electrode 28 is joined on the part projecting from the back surface of the connection electrode 28 which is formed to the semiconductor chip 1 which is positioned at the lower layer via the solder, further, the under film 43 is filled in, and thereby the other semiconductor chips 1 which are successively laminated on the semiconductor chips 1 thereof are held and fixed on the semiconductor chip 1 which is positioned at the lower layer. Moreover, the electrode 4 is formed on the semiconductor device 3 which is positioned at the top layer. The electrode 4 has the same constitution as the part projecting from the side of the active surface of the semiconductor chip 1, and the concave portion is formed to the front end portion thereof, the solder is coated at the inner portion thereof. The electrode 4 is joined to the part projecting from the side of the back surface on the connection electrode 28 which is formed to the semiconductor chip 1 which is positioned at the lower layer via the solder, further, the underfilm 43 is filled in.

Here, in order to laminate the other semiconductor chip 1 on the semiconductor chip 1, first, flux (not shown in the figures) is coated on the solder 32 which is formed at the part projecting from the back surface of the connection electrode 28 of the semiconductor chip 1 at the side of the lower layer, or at the part projecting from the side of the active surface of the connection electrode 28 of the semiconductor chip 1 at the side of the upper layer, and thereby the improvement of the wetting property of the solder is attempted. The methods using a dispenser, an ink-jet, and a transfer, and the like can be mentioned as the methods of supplying the flux.

Next, the positioning is performed so that the part projecting from the side of the active surface of the connection electrode 28 of the semiconductor chip 1 at the side of the upper layer contacts with the part projecting from the side of the back surface of the connection electrode 28 of the semiconductor chip 1 at the side of the lower layer via the solder 32 and the flux. Next, by reflow junction due to heating, or by flip chip mounting due to heat pressing, the solder 32 is melted and solidified, and, as shown in FIG. 16, the connection electrode 28 which is formed to the semiconductor chip 1, at the side of lower layer and the connection electrode 28 which is formed to the semiconductor chip 1 at the side of upper layer are joined with the solder.

As the apparatus which melts the solder 32, besides using the reflow furnace, a hot plate, an optical beam heating apparatus, a drier, a laser heating apparatus, or the like can be used. In addition, when the semiconductor chip 1 is laminated by one layer, a flip chip bond (FCB) can be used. In this case, the connection electrode 28 which is formed on the laminated semiconductor chips 1 is suitably floated at approximately 70% to 200% of the depth of the concave portion 30 from the concave portion 30 of the connection electrode 28 which is formed to the other semiconductor chip 1.

At this time, because the connection electrode 28 is projected from either of the sides of the active surface and the back surface of the semiconductor chip 1, the positioning thereof becomes easy, while, by forming the solder 32 at the front end of the part projecting from the side of the active surface, these can be easily joined. Moreover, because the outside diameter (size) of the part projecting from the side of the active surface of the semiconductor wafer 10 of the connection electrode 28 is larger than the outside diameter of the insulated film 22 which covers the part projecting from the side of the back surface of the semiconductor chip 1, the wetting property with the joined solder is improved, and the junction power thereof becomes large. For this reason, the junction between the connection electrodes 28 can be made consistent and reliable.

Moreover, in the case of the semiconductor chip 1 of which constitution is shown in FIG. 15, because the side surface of the connection electrode 28 is in the state of being exposed, the solder is easier to wet and to join at this part. Therefore, because, at both the part projecting from the side of the active surface of the semiconductor chip 1 of the connection electrode 28 and the part in which the conductor projecting from the side of the back surface is exposed, the solder is easier to wet and to join, the solder is joined to the connection electrode 28 more suitably, the fillet is formed, and thereby better joining can be performed.

(Circuit Substrate)

Figure 17:
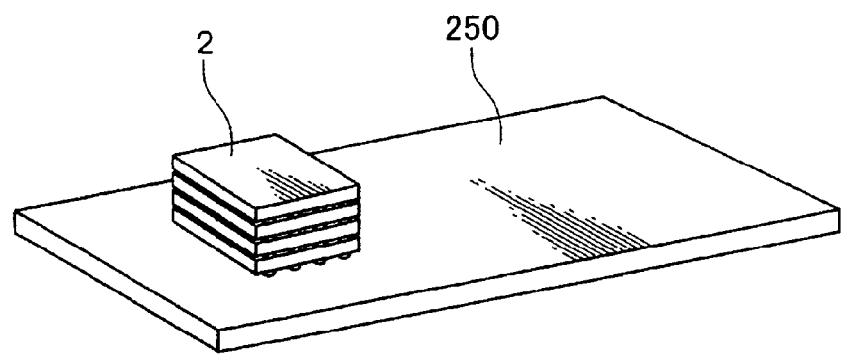
FIG. 17 is a perspective view which shows a schematic construction of the circuit substrate according to the present embodiment.

Next, examples of the circuit substrate which is provided with the above-mentioned semiconductor apparatus 2 and the electronic apparatus are explained. FIG. 17 is a perspective view which shows the schematic construction of the circuit substrate according to one embodiment of the present invention. As shown in FIG. 17, the above-mentioned semiconductor apparatus 2 is mounted on the circuit substrate 250 according to the present embodiment. The circuit substrate 250 is composed of, for example, an organic system substrate such as a glass epoxy substrate, and the like. Furthermore, the circuit substrate 250 is formed so that, for example, the wiring patterns (not shown in the figures) which are composed of, for example, copper, and the like become a desired circuit, further, the electrode pad (not shown in the figures) is connected to the wiring patterns thereof.

Furthermore, the solder ball 42 of the above-mentioned interposer substrate 40 in the semiconductor apparatus 2 is electrically connected to the electric pad, and thereby the semiconductor apparatus 2 is mounted on the circuit substrate 250. Here, the mounting of the semiconductor apparatus 2 on the circuit substrate 250 is performed by connecting the solder ball 42 of the interposer substrate 40 to the above-mentioned electric pad at the side of the circuit substrate 250 using the reflow method or the flip chip bond method.

Because the circuit substrate 250 as such a constitution is provided with the semiconductor apparatus 2 in which high density mounting is performed, the miniaturization and the weight saving are attained, and the high reliability of the wiring connection is also attained. In addition, besides the semiconductor chip 1 being laminated on the same semiconductor chip 1, or on the different various semiconductor apparatuses 3, the semiconductor chip 1 may be laminated on a silicon substrate, a polyimide substrate, a semiconductor apparatus to which the dicing is performed, or a wafer before being diced (a wafer in which the semiconductor apparatus is mounted). The same constitution is applied to the above-mentioned semiconductor apparatus 2.

(Electronic Apparatus)

Figure 18:
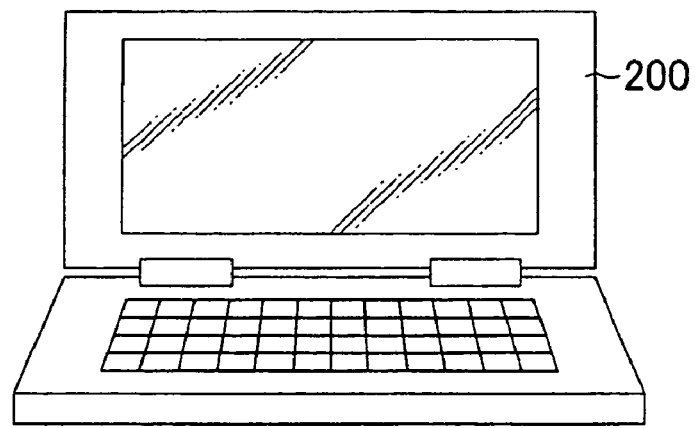
FIG. 18 is a view which shows an example of an electronic apparatus according to the present embodiment.
Figure 19:
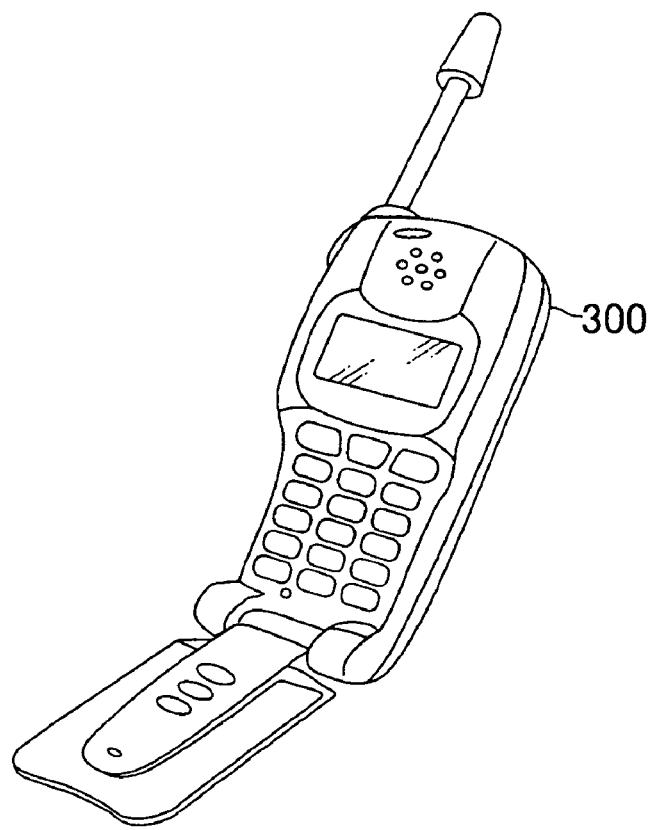
FIG. 19 is a view which shows an example of an electronic apparatus according to the present embodiment.

As the electronic apparatus which is provided with the semiconductor apparatus according to the embodiment of the present invention, the note book type of personal computer 200 is shown in FIG. 18, and the portable phone 300 is shown in FIG. 19. The above-mentioned semiconductor apparatus 2 or the above-mentioned circuit substrate 250 is provided at the inside of the personal computer 200 or the portable phone 300. Because the personal computer 200 or the portable phone 300 which has the above-mentioned constitution is provided with the semiconductor apparatus 2 of which mounting density is high, the miniaturization and the weight saving are attained, and the high reliability of the wiring connection is also attained.

In addition, the application of the electronic apparatus according to the present invention is not limited to the above-mentioned note book type of personal computer and the portable phone, and the electronic apparatus according to the present invention can be applied to various kinds of electronic apparatuses. For example, the electronic apparatus according to the present invention can be applied to a liquid crystal projector, a personal computer (PC) and an engineering workstation (EWS) corresponding to multimedia, a pager, a word processor, a television, a videotape recorder which is a view finder type or a monitor viewing type, an electronic notebook, an electronic table-top calculator, a car navigation apparatus, a POS terminal, an apparatus which is provided with a touch panel, and the like.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims. Furthermore, concrete materials and layer constitution which are mentioned in the present embodiment are only one example, proper modification can be performed. For example, although, in the above-mentioned embodiment, an example in the case of using the lead-free solder as the wax material is explained, tin, silver, metal paste, melting paste, and the like may be used.

What is claimed is:

1. A manufacturing method of a dicing sheet which supports electronic-component aggregation with adhesive in the case of separating the electronic-component aggregation in which a plurality of electronic components are integrated, the manufacturing method comprising: forming an adhesion layer so as to cover one surface side of a support member, and forming a concave portion in which a convex shape member projected from the electronic-component aggregation is inserted on a surface of the adhesion layer.

2. A manufacturing method of a dicing sheet according to claim 1, wherein the concave portion is formed by pressing a metal mold which is provided with a predetermined roughness shape to the adhesion layer.

3. A manufacturing method of a dicing sheet according to claim 2, wherein, when the concave portion is formed to the adhesion layer, the metal mold which is in the state of being heated up at temperature of less than 100□ is pressed to the adhesion layer.

4. A manufacturing method of a dicing sheet according to claim 1, wherein, when the concave portion is formed to the adhesion layer, the concave portion is formed by cutting the adhesion layer partially.

5. A manufacturing method of a dicing sheet according to claim 1, wherein, when the concave portion is formed to the adhesion layer, the concave portion is formed by emitting the laser beam to the adhesion layer.

6. A manufacturing method of a dicing sheet according to claim 1, wherein, the process of forming the concave portion comprises performing pattern formation of mask material on the adhesion layer, and forming the concave portion by partially removing the adhesion layer via the mask material.

7. A manufacturing method of a dicing sheet according to claim 1, wherein, when the concave portion is formed to the adhesive layer or the adhesive sheet, the alignment mark for positioning the convex shape member of the electronic-component aggregation to the concave portion is formed on the adhesive layer or the adhesive sheet at the same time as the manufacturing of the concave portion.

8. The manufacturing method of a dicing sheet according to claim 1, the manufacturing method comprising: forming an alignment mark on the support member in advance of forming the adhesive layer on the support member, wherein the concave portion is formed at a predetermined position on the support member with a standard of the alignment mark on the support member.

9. The manufacturing method of a dicing sheet according to claim 1, wherein the concave portion is formed so as not to contact a side of the convex shape member.

10. A manufacturing method of a dicing sheet which supports electronic-component aggregation with adhesive in the case of separating the electronic-component aggregation in which a plurality of electronic components are integrated, the manufacturing method comprising: attaching an adhesion sheet which is provided with a concave portion at a position corresponding to the convex shape member projected from the electronic-component aggregation to one surface side of a support member.

11. The manufacturing method of a dicing sheet according to claim 10, wherein the concave portion is formed so as not to contact a side of the convex shape member.

12. A manufacturing method of a semiconductor apparatus for separating a plurality of semiconductor chips which are formed on a semiconductor wafer, the manufacturing method comprising: laying a dicing sheet which is provided with a support member, and an adhesive layer which is formed so as to cover one surface side of the support member; forming a concave portion in which a convex shape member projected from the semiconductor wafer is inserted on a surface of the adhesive layer of the dicing sheet; inserting the convex shape member into the concave portion of the adhesive layer; adhering the semiconductor wafer and the adhesive layer to each other; and cutting the 13. The manufacturing method of a dicing sheet according to claim 12, wherein the concave portion is formed so as not to contact a side of the convex shape member. semiconductor wafer.

14. A dicing sheet which supports electronic-component aggregation with adhesive in the case of separating the electronic-component aggregation in which a plurality of electronic components are integrated, comprising: a support member; and an adhesion layer which is formed so as to cover one surface side of the support member, wherein a concave portion is formed on a surface of the adhesion layer, and the concave portion is formed so that a convex shape member projected from an adhesion surface of the electronic-component aggregation which is adhered to the dicing sheet is inserted.

15. A dicing sheet according to claim 14, wherein the concave portions are formed corresponding to the plurality of convex shape members which are provided at the electronic-component aggregation.

16. A dicing sheet according to claim 14, wherein the concave portion is formed having a plane surface area which extends over the plurality of convex shape members provided at the electronic-component aggregation.

17. A dicing sheet according to claim 14, wherein the layer thickness of the adhesion layer is not less than 70% of the projection height of the convex shape member, and the depth of the concave portion is not less than 50% of the projection height thereof.

18. A dicing sheet according to claim 17, wherein the concave portion is formed penetrating the adhesion layer.

19. A dicing sheet according to claim 14, wherein an alignment mark for positioning with the electronic-component aggregation is provided.

20. A dicing sheet according to claim 19, wherein the alignment mark is formed while making a concave shape on a surface of the adhesion layer.

21. A dicing sheet according to claim 14, wherein a formation area of the concave portion and a cutting line for dividing the electronic component are arranged while being horizontally apart from each other.

22. The dicing sheet according to claim 14, wherein the concave portion is formed so as not to contact a side of the convex shape member.

* * * * *